(12) United States Patent
Lyke

(10) Patent No.: US 6,215,327 B1
(45) Date of Patent: Apr. 10, 2001

(54) MOLECULAR FIELD PROGRAMMABLE GATE ARRAY

(75) Inventor: James C. Lyke, Albuquerque, NM (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/387,992

(22) Filed: Sep. 1, 1999

(51) Int. Cl.$^7$ ...................... H03K 19/177; H03K 19/003
(52) U.S. Cl. ................. 326/41; 326/38; 326/10
(58) Field of Search ................. 326/41, 38, 39, 326/40, 10, 47

(56) References Cited

U.S. PATENT DOCUMENTS

| | | | | |
|---|---|---|---|---|
| 4,918,440 | * | 4/1990 | Furtek | 340/825.83 |
| 5,959,871 | * | 3/1999 | Pierzchala et al. | 364/489 |
| 6,014,509 | * | 1/2000 | Furtek et al. | 395/500.17 |
| 6,034,542 | * | 3/2000 | Ridgeway | 326/39 |

OTHER PUBLICATIONS

Champeau et al., Flexible Parallel FPGA–Based Architecture with ArMen, 1994 IEEE Proceedings of Twenty–Seventh Annual Hawaii International Conference on System Sciences, pp 105–113, 1994.*

Mills et al., Lukasiewicz Logic Arrays, Multiple–Valued Logic 1990, Proceedings of the Twentieth International Syn, pp 4–10, 1990.*

Guler et al., Built–in Self–test Generator Design using Nonuniform Cellular Automata Model, IEEE Proceedings Circuits Devices and System, vol. 145. No. 3, pp 155–161, Jun. 1998.*

Nagami et al. Plastic Cell Architecture: Towards Reconfigurable Computing fo General–Purpose, Proceedings IEEE Symposium, pp68–77, May 1998.*

* cited by examiner

Primary Examiner—Michael Tokar
Assistant Examiner—James H. Cho
(74) Attorney, Agent, or Firm—Kenneth E. Callahan

(57) ABSTRACT

An architectural concept for field programmable gate array circuits is presented based on a universal fabric of cells called look-up tables arranged in a direct, repeatable spatial grid. It is predicated upon an analogy between Boolean functions and cellular automata wherein an m-variable look-up table defines a universal cellular automata of neighborhood size m. Its unique features include universal implementation of Boolean functions, low interconnect demand, no specialized routing resources, high regularity (periodic structures), fault tolerance, and ease in testability.

6 Claims, 42 Drawing Sheets

Illustrating flow of programming bitstream.

Iterable array based on 3-input lookup tables.

Symbolic representations of 3 - LUT

A possible 5 - LUT molecular FPGA cell.
(a) 5 - LUT Tesselation symbol. (b) Dependency arrangement.

Example of a two-dimensional MFPGA architecture based on a 4 - LUT.
(a) Symbol for a single cell or node. General functional representation is f(N,E,W,S), where N=north, E=east, W=west, S=south.
(b) Tesselation symbol for this 4 - LUT.
(c) Dependency arrangement.

MOLECULAR FIELD PROGRAMMABLE GATE ARRAY

STATEMENT OF GOVERNMENT INTEREST

The conditions under which this invention was made are such as to entitle the Government of the United States under paragraph 1(a) of Executive Order 10096, as represented by the Secretary of the Air Force, to the entire right, title and interest therein, including foreign rights.

BACKGROUND OF THE INVENTION

1. Field of the Invention

The invention relates to field programmable gate array circuits used in digital circuit design, and in particular, to an architectural design for their implementation on a molecular level.

2. Description of the Prior Art

This description outlines the prior practices in digital systems design and the construction of the gate array forms of integrated circuits.

A wide class of digital circuitry, referred to as clocked-mode (synchronous) digital systems, can be represented in a form shown in FIG. 1. Any clocked-mode system can be represented as a "block" of combinational logic and a linear array of registers. Combinational logic makes binary ("0" or "1") decisions based on Boolean functions of binary inputs and is the generalization of combinations of simple logic gates having one or two inputs (e.g., "AND", "OR", etc.) to a "block" of potentially many logic gates that inter-relate m inputs and n outputs. Even as a two-input "AND" gate relates a nearly trivial configuration of m=2 inputs and n=1 output, a generalized combinational logic block might have hundreds or more inputs and outputs.

The second part of a clocked-mode digital system, a linear array of registers, is equivalent in this representation to a set of data ("D") flip-flops with a single, common clock input. The data inputs to the array of registers come from each of the n outputs of the combinational logic block. The outputs of these registers are then either: (1) outputs (y(t)) of the digital circuitry block, or (2) inputs that are "fed" back (quantity of r signals) into the combinational logic block (h(t)). The registers synchronize the overall operation of a clocked-mode digital system by permitting a change in the outputs only in relation to a single clock. This feature of synchronization is important since it is minimizes perturbations, especially in the inputs that are "fed" back into the combinational logic circuitry (eliminating the so-called "race" conditions). This approach to digital design is popular, predictable (easily modeled), and well-suited to automatic design methods, because when exploited properly, it creates circuitry with completely deterministic behavior.

In other digital systems representations and design approaches (referred to as asynchronous digital systems), the need for such synchronization is relaxed, albeit with considerably more involved design and analysis. The class of asynchronous systems can be shown to be the most general digital representation, and clocked-mode representations are a subset of asynchronous systems. In asynchronous systems, the lack of synchronizing/latching structures like registers and flip-flops make designs much more complex, and sometimes the feedback paths that give rise to sequential behavior become sensitive to process and circuit layout particulars that may escape less careful analyses. Mismatches in timing of paths within a circuit can create the well known hazard and "race" conditions where undesired transitions occur based on skewed information delivery to decision points within the circuitry. Most of the present invention is based on a synchronous model, but templates will also be discussed that can support a rich variety of asynchronous interactions as well.

The clocked-mode of representation is the basis of most digital circuitry today, to include finite state machines, micro-sequencers, central processing units, and many custom designs. As most of the automated synthesis of contemporary digital systems designs is based on clocked-mode representations and since many field programmable gate arrays are intended for this mode of operation, this restriction does not significantly limit utility of the present invention. The key restriction to the application of clocked-mode circuitry is the existence of a single "synchronization domain", i.e., a single common clock controls the actions of the register array.

Very complex circuits contain multiple synchronization domains. It is not uncommon to divide very complex digital designs into synchronous and asynchronous sections, in which cases the synchronous content is usually dominant and lends itself to automatic design approaches. A full discussion of the ad hoc processes for multi-domain and asynchronous digital design are considerably involved and only have referential pertinence to the present invention. It is sufficient to indicate that the core concept of the present invention is based on approaches applicable to a single or a small number of synchronization domain(s) of a complex clocked-mode circuit. Asynchronous circuits can of course be more complex, since the synchronization domains may be ad hoc and in fact may be difficult to ascertain, which is among many of the reasons why asynchronous design is more complex and less represented in automated design approaches.

The role of storage and feedback in digital systems is necessary in order to implement stable and history-dependent behavior in a circuit. Combinational circuitry acts on the immediate values of input variables, which when changed or removed, can create a change in the output function. Changes in an output of a block of combinational logic are therefore subject to variations in the inputs. They are also subject to delays in the time responsiveness of the combinational circuitry itself, a real world effect which is largely due to the speed of signal propagation in circuit elements and the sluggishness of the circuitry to sudden changes (due to, for example, capacitive effects). Since digital systems need to rely on stable information, it is important that a decision based on the output of a combinational block be made after all delay effects have subsided. For this reason, the use of a register array is important, because it represents a snapshot in time of what should be the correct output of the combination circuitry. After the snapshot is taken, the inputs of the preceding combinational circuitry can change without affecting the registered output. Hence, "registered" can be thought of as "registration", in this case, registration to the edge of a pulsed clock signal. The highest speed at which a synchronous digital circuit can be operated is limited by the frequency of the clock pulses, and this frequency is limited by the longest combinational circuit path. Careful management of the delay effects and knowing when new inputs can be provided to the circuitry and when the clock can be "advanced" are the hallmarks of the present art of high-performance digital design. The registers in clocked-mode circuitry clearly facilitate the stability necessary for achieving this performance. Furthermore, when registers can provide feedback to the combinational network, they permit history-dependent behavior. The registers that are fed back into the combinational circuitry block can be said to encode state information.

Since combinational circuitry generates output(s) based on a Boolean function of one or more (or all) inputs, they can generate the value of, among other things, the value of the next state. Decoupled by the synchronization structure provided through the register array, this state is latched in by the clock to become the "new" (next) state. Finite state machine (FSM) behavior is strictly a manifestation of the existence of state information, hence the use of feedback is necessary for implementing complex digital systems. Generation of both outputs and states is accomplished through the combinational circuitry, and the snapshot of the current, correct outputs and states is accomplished through the register array.

It is important to observe the two extremes under which the combinational part of the synchronous digital system can be implemented. In the first extreme case, a combinational circuit can be represented as a very large look-up table (LUT). Since a combinational circuit with m inputs can be completely specified by truth table of $2^m$ entries, it is simple conceptually to consider a circuit where all of these entries are contained in an electronic LUT, which is equivalent to a brute force electronic implementation of a truth table. A simple example based on a two-input AND gate is shown in FIG. 2. In FIG. 2(a), the symbol of the circuit is shown. In FIG. 2(b), the truth table which enumerates each of the $2^2=4$ combinational possibilities is shown. In FIG. 2(c), a brute force matrix implements a look-up table (LUT) based on decoders and a matrix. The decoder is simply a circuit that has an output that is active ("high" or logical state "1") for only one of each possible combination of the inputs, which is identical to the number of truth table entries ($2^m$). The matrix implements the truth table using a brute force approach. The column wire represents the output of the look up table. Here, the presence of a diode between a row and the single column is equivalent to having a logical "1" for the corresponding entry in the truth table. For the AND gate, of course, this condition only occurs when both inputs are high. The diodes are used instead of ordinary wires to prevent shorting through reverse paths, which becomes important for the case where more than one column exists.

It is a simple matter to extend the number of outputs by adding columns. For example, to implement the two function circuit in FIG. 3(a), which is an AND gate in parallel with an OR gate for the same inputs a and b, the circuit in FIG. 2(c), is expanded by adding another column. Of course, this in effect implements both truth tables of FIG. 3(b), resulting in the fmal circuit in FIG. 3(c).

Of course, these illustrative examples are not practical, primarily because the decoding circuitry itself is more complicated than the simplistic target example being shown. It is clear, however, as the approach is extended to more complex examples, that the decoding overhead becomes a less significant fraction of the circuit in question. The primary objective of this discussion is to provide a framework for discussing one extreme in implementing a combinational logic circuit with m inputs and n outputs. In summary, the look-up tables in this context are shown to consist of a decoder circuit for m inputs, and a m×n matrix with diodes representing entries where a logical "1" is present (for the truth table entry corresponding to that particular row and the output corresponding to that particular output) and without any diodes at all where a logic "0" is present.

It is important before examining the other extreme in combinational logic implementation to explore the matrix itself of the look-up table just described. Clearly, this look-up table represents information content, corresponding to a pattern of ones and zeros in number of truth tables (one for each output). In contemporary design, it is possible and normal to use a memory device to implement such information. Hence, a memory device can implement a look-up table. In FIG. 4, two examples of a memory are shown in look-up table applications. In FIG. 4(a), a very simple 16-bit memory (another illustrative but impractical device example) is shown, which has four inputs and a single output. For these examples, the control signals are omitted for clarity. The four input memory is identical to a four-input lookup table, which can notionally be any conceivable Boolean function of four inputs. In one example (FIG. 4(b)), a four-input OR gate is represented. A second example using the 16-bit memory, shown in (FIG. 4(c)), implements a more complex function, equivalent to several individual combinational logic gates. Considerably more complex fimctions are obviously possible, given the very dense memories available in contemporary integrated circuit design. For example, a semiconductor memory shown in FIG. 4(d), simple by modern standards, contains one megabit ($2^{20}$) of storage, which in this form can implement a combinational network of as many as 17 inputs and 8 outputs. This memory can (by definition) implement any eight independent truth tables or Boolean finctions (one for each of the eight outputs) of the same 17 input variables.

It is clear that every technology that has been used to implement a memory can be used to implement a look-up table. Common classes of such semiconductor memory include permanent, read only memory (ROM), programmable (usually fuse-link based) read-only memory (PROM), erasable (otherwise permanent) read-only memory (EPROM, UVPROM, EEPROM, "flash" ROM, etc.), and random-access memory (RAM). ROM and PROM memories and considered "one time programmable", useful for fixed implementations, but generally un-alterable. RAM-based approaches, on the other hand, can be altered at will (i.e., they are reconfigurable), provided that circuitry for re-configuration is built into the design. These two tenets—re-configurability and the means of re-configuration—are the cornerstones of field programmable gate arrays (FPGA), and these concepts are central certainly to the present invention as they are central to nearly every other existing FPGA.

Although a look-up table (LUT) implemented as memory is a clear and powerful technique for implementing a "block" of combinational logic, the more direct approach is to simply use individual logic gates, wired together as necessary, to form general combination logic networks. Hence, rather than implement the circuit in FIG. 4(c) as a 16-bit memory, the seven discrete logic elements (AND, OR, and inverter or "NOT" gates) would be used. Why use this method, given the conceptual simplicity of memory devices? Several reasons exist, but the simplest justification is derived from the example of a 100-input AND device. The device is conceptually simple, as it is merely a combinational logic circuit with 100 inputs and a single output. The device outputs a logical "1" only when all inputs are equal to logical "1"; otherwise, the output is logical "0". Implementing this device as a memory is intractable by present standards, as it would require a memory containing $2^{100}$ bits of memory! As a direct implementation, however, it is simple to implement. Even built from elemental 2-input AND gates, this function would require only approximately $(N/2)*\log_2(N)$ (~50) gates to implement. It is clear that the number of logic gates required to implement a Boolean fuiction varies with its complexity of the function. The number of elemental (e.g. 2- or 3-input) gates needed to implement can be exponentially complex in the very worst case. However, in the vast majority of cases, logic functions for commonly used designs have much less complexity on average than the very worst case. Unfortunately, using a memory to implement logic always results in an exponential amount of circuitry, regardless of what finction is implemented, whether simple or complex.

A compromise between implementing a combinational logic block as an impossibly large but infinitely flexible memory device (serving as a massive LUT) and a large array of direct but inflexible logic devices is the fertile ground from which the field programmable gate array (FPGA) device field has been born. If this argument has a "punch line", it is that FPGA devices employ the use of many elemental LUTs in an interconnection matrix of wires that can be re-routed to some degree by software. The approach is summarized in FIG. 5. It seems that "total control" is possible, since both the behavior and connections are controllable. The behavior is controlled by establishing a desired pattern of ones and zeros in the various LUTs, and the connections are controlled by exploiting whatever reconfiguration potential exists in the routing manifold. LUT-based approaches bear attributes in common with both memory-based and gate-based implementation schemes. Since LUTs are in effect a memory, the offer the flexibility of memory. The difference is that in order to implement functions with large numbers of inputs, several LUTs are used instead of one massive memory. If, for example, a 12-input function could be implemented with four, 3-input LUTs, the total number of memory bits is 4*2^3=32 memory bits. On the other hand, with a memory-only approach, a similar implementation necessarily requires 2^12=4,096 memory bits (equivalent to 128, 3-input LUTs). The LUT-based approach achieves dramatic economy in storage requirements over brute-force memory approaches by limiting growth of bits in any single memory (LUT), and then relying on having the ability to apply many such LUTs to implement Boolean functions. In this respect, LUT-based approaches resemble approaches based on using elemental gates. The difference, of course, is that LUTs are capable of implementing any gate with the same number of inputs. There are, however, essentially two compromises in effect: (1) the fine mesh of LUTs can implement any function of only a small number of inputs and may not be able to implement all conceivable Boolean functions of larger numbers of inputs, and (2) the routing interconnection network must necessarily contain compromises that restrict some routing possibilities. The end product then is a sort of emulation of a direct approach in combinational logic using some granularization (no super-large LUTs) into a number of element LUTs with a manifold of interconnections. For RAM-based FPGAs, of course, both the contents of the LUTs and the switch patterns of the routing network are user re-configurable.

Contemporary field programmable gate arrays (FPGAs) are built as monolithic integrated circuits (ICs), usually involving silicon semiconductor technology. The technology of semiconductor fabrication involves a variety of processes that can be divided into high temperature (>600 degrees Celsius) and low temperature (<600 degrees Celsius). The high temperature processes include diffusions and oxidations, while low temperature processes include the metallization (wiring between transistors). Low temperature metallizations must be done after all high-temperature processing is completed. Performing an IC fabrication involves the serial processing of a group of wafers (lot) through many high and low temperature processes.

In the early days of digital ICs, all designs were done based on completely customized layouts of all IC features, including transistors and interconnects. It was later learned that the high temperature steps could be done generically for a large group of wafers, which could be stockpiled. When orders for specific IC devices were needed, these semi-fabricated wafers could be completed by finishing only the last few low-temperature steps, dramatically improved the pace at which customer orders for ICs could be filled. By changing only the last steps of nearly fabricated wafers, it was found that large classes of digital designs could be created by establishing a dense planar grid of transistor diffusions on the surface of a wafer and stockpiling them with undefmed metal layers. To form finalized integrated circuits, it was necessary to specify the metal interconnections between the pre-fabricated diffusions/transistors (through layout). Since the time-consuming and complex task of the transistor fabrication was already done, the simpler design and fabrication steps involving metal interconnections could be done in a very short time. Such devices, referred to as gate arrays, are used to implement complex digital integrated circuits quickly by personalizing the metal interconnections on silicon wafers that contain a large pre-fabricated array of transistors. "Personalization" is an act of design that allows the wafer to be mask-customized for specific functions through the process of integrated circuit layout, which involves a variety of patterning steps through which intentional designs are conveyed during fabrication.

Field programmable gate arrays (FPGAs) carry the analogy of speedy customization of partially fabricated gate arrays one step further. In particular, FPGAs defer the functional specification of its internal circuit configuration until after the chip is built through software. In this case, a designer personalizes (using software only) the configuration of IC "chips" that are completely pre-fabricated and sometimes in the user's own inventory, dramatically reducing the time to achieve a specialized IC as the delay of fabrication is completely eliminated. FPGAs rely on a large number of special pre-fabricated circuit structures that can be configured and connected under software control to form finctions that are in many cases equivalent to those that would otherwise be built with "semi"-prefabricated gate arrays or fully customized designs.

FPGAs can be viewed as devices that predominately contain large numbers of logic and routing "resources." They can in some sense be viewed as a pool of building blocks that can be configured and connected at will into more complex circuits. Physically, this is not done by adding material (e.g., wires) to the device but by setting and clearing bit patterns in what is referred to as a device configuration memory. The bits of the configuration memory have nothing to do with the device's actual operation, but rather correspond to the specification of a behavior pattern (for logic resources) or the bridging/separation of wiring paths between various points within the device. Configuration memory specifies the operation of the device, just as software specifies the operation of a computer. But whereas a computer is based on blocks of logic and wiring that are fixed, the FPGA creates in effect the appearance of a moldable block of logic and resources. The bridges in physical reality are always present or have the potential of being present nearly everywhere in the device. The design process then for FPGAs is reduced to specifying a particular subset of the potential connections and behaviors necessary to effect a desired deliberate overall circuit. This circuit for almost all intents and purposes performs in a manner indistinguishable from a circuit made in a more traditional way (gate array or fill custom).

The patterns impressed into FPGAs to form circuits can be reversible or permanent, depending on the underlying process used to fabricate the original device. The reversible FPGAs are said to be re-configurable, whereas the permanent FPGAs are said to be "one-time programmable." Since this invention is concerned only with reversible patterns, only those FPGAs will be discussed further here.

In reversible or re-configurable FPGAs, the configuration pattern that defmes device behavior is usually transmitted electrically into the device upon the initial application of power into the device. In RAM-based FPGAs, the configuration of the FPGA is persistent only for as long as power is applied to the device. Once power is interrupted, the pattern is lost and must be re-established. In practice, this need to re-fresh can be handled in several standard ways, and in fact is often desirable as a feature. Such RAM-based FPGAs can be updated even after a system containing them has been placed in service. In RAM-based FPGAs, logic and routing resources comprise the essential building blocks from which general-purpose digital systems can be made.

The most important concept for implementing logic resources in the FPGA is the look-up table (LUT). A LUT can be viewed as a Boolean function generator of m Boolean input variables. Since m inputs can be formed in $2^m$ possible ways, it is relatively straightforward to form an m-input LUT with a $2^m$-bit memory that has a one-bit wide data path and m address bits. Two possible equivalent implementations of a 3-input look-up table (3-LUT) are shown in FIG. 6. In the figure, A is the symbol of 3-LUT; B is the K-map representation; C is the implementation using N-pass transistors; and D is the implementation using 2-input logic gates.

LUTs are capable of implementing all $2^{(2^m)}$ possible functions of m variables, and in any sense, the m-LUTs (LUTs with m input variables) are completely capable of simulating/implementing any m-input function.

Since general digital systems must be capable of history-dependent behavior, it is important to implement memory in designs. For many LUT-based designs, a single memory bit is included at the output of each LUT. When implemented as shown in FIG. 7, a memory feature can be optionally incorporated in a LUT. A multiplexer (data selector) allows the use/bypass of a single memory bit (shown in the form of a "data" or "D" flip-flop) when the data selector is set to a "1" or "0" by the state of a single configuration memory bit. When selected, the output of the LUT is registered in synchronization with the clock signal. This establishes the basis for state machine behavior. In this case, the contents of memory comprise the state. When the data selector is bypassed, the output of the LUT is passed directly to the output.

FPGAs also contain routing resources, which are usually in the form of wires and transistor-based switches between those wires. A piece of the routing fabric that might be contained in a typical FPGA is shown in FIG. 8. In this example, 12 wires (labeled "a" through "l") and 20 switches (not labeled) are shown. The circle represents a switch as shown in FIG. 8(b). The switch is controlled by a single bit of configuration memory, which shorts together the wires when set to "1", and otherwise leaves the wires open-connected. Symbolically, an open circle represents an open switch and a filled circle a closed switch. For illustrative purposes, FIG. 8(c) depicts a battery at terminal "a" connected to a light bulb at terminal "f". As shown in FIG. 8(d), in order to turn on the light, at least two switches must be closed.

It is true today and it will always be likely that FPGAs by their very nature will inferior in performance to devices made using fixed wiring integrated circuits, such as standard cell gate arrays or full custom designs. Here, performance refers to speed and density. This is due to the fact that FPGAs implement much more routing circuitry than an equivalent gate array or full custom IC (which connect metal wires only between intended points on a specific design). Correspondingly, FPGAs are much more sluggish due to excess parasitic capacitance associated with the additional interconnect needed to guarantee the possibility of general connection to many points with possible designs. Another factor in the sluggishness of FPGAs is the extra amount of silicon required to permit reconfiguration. According to DeHon, an FPGA may take 100× silicon area to implement the equivalent function in a fixed-wire, fixed-logic approach (i.e., the standard cell gate array or full custom IC). [DeHon, Andre. "Reconfigurable Architectures for General-Purpose Computing". Massachusetts Institute of Technology, A.I. Technical Report No. 1586, October 1996]. As such, there is additional propagation delay due to time of flight over a longer distance. Since both the additional capacitance and time of flight are delay factors, the FPGAs are generally incapable of the maximum possible performance in any given silicon technology.

For reasons of performance, modem silicon FPGAs employ structures that at their essence are the same LUTs and routing resources previously described, but far more elaborate. In fact, 80–90% of the silicon area of typical FPGAs are dominated by interconnection-related resources. The embellishments attempt to enhance the performance of FPGAs and improve their generality in application the widest cross section of digital designs that are popular at the time of introduction. In the research of considerably advanced electronics, in which the critical device dimensions are on a nanometer scale, many problems fundamental to device engineering exists. At these dimensions, no effective lithographic techniques exist. Furthermore, interconnection supplies appear to be very constrained. While even at contemporary device scales (180–250 nm) these problems exist, it is still practical to assemble circuits where an individual node might have hundreds of connections. At the nanometer scale, particularly for molecular electronics, it appears possible to converge only a very limited number of electronic connections at a single physical location (e.g., 2–6). Finally, it is likely that many random defects will occur in electronics fabricated at a molecular scale. Only structures that appear to have high regularity are likely to have the ability to recover fimctionality in the presence of such defects. As such, many ordinary architectures designed in silicon, where defect densities are controllable, will be unsuitable for application at a nano-scale, due to interconnection demand.

SUMMARY OF THE INVENTION

The molecular field programmable gate array (MFPGA) is an architectural concept for field programmable gate array (FPGA) circuits that can be implemented in a variety of technologies, e.g., silicon very large scale integration (VLSI), but that would be particularly useful for nanoelectronic/molecular-scale applications. c A "universal" fabric of cells called look-up tables (LUTs) is arranged in a directed, repeatable x, y grid. The grid is called "universal"

because the LUTs can implement logic and/or interconnect (interconnect considered as a special case of logic). The FPGA is not especially intended to be as spatially efficient as other silicon-based FPGAs, as this property is compensated for in nano-electronic/molecular-level designs by sheer density of cells. It is likely, however, that some circuit designs will nevertheless have very efficient implementation (i.e., they will map well). By the same token, it is expected that some Boolean fimctions, especially those with high interconnection demand, will not map efficiently into MFPGA-based architectures.

The simple, repeatable pattern of cells is easily tested by setting up temporary programmations of the LUT cells designed to identify and isolate faults and replacing the trial programmations with application-specific "permanent" programmations ("permanent" is a relative term, as programmations can be altered at will.). Since the fabric is intended for very dense implementations, a number of isolated faults can be circumlocuted in software using a robust synthesis procedure. In this manner, the MFPGA is fault tolerant. The basic fabric of the MFPGA is intended to implement combinational functions. To provide complete capability for universal Boolean synthesis, it is necessary to provide sequential storage and feedback. This is accomplished by periodically punctuating the architecture with register vectors. Through careful arrangement of fabric sections and registers, a variety of feedback paths can be established. Input/output to the MFPGA are subject to "cones of influence." This is an artifact of the intended molecular level implementation, in which it is not possible to attach an electrical terminal to every input/output signal in the MFPGA device. These "cones of influence" are identified for deliberate exploitation in any associated synthesis procedure involving the MFPGA devices.

DESCRIPTION OF THE PREFERRED EMBODIMENT

Figure 9:
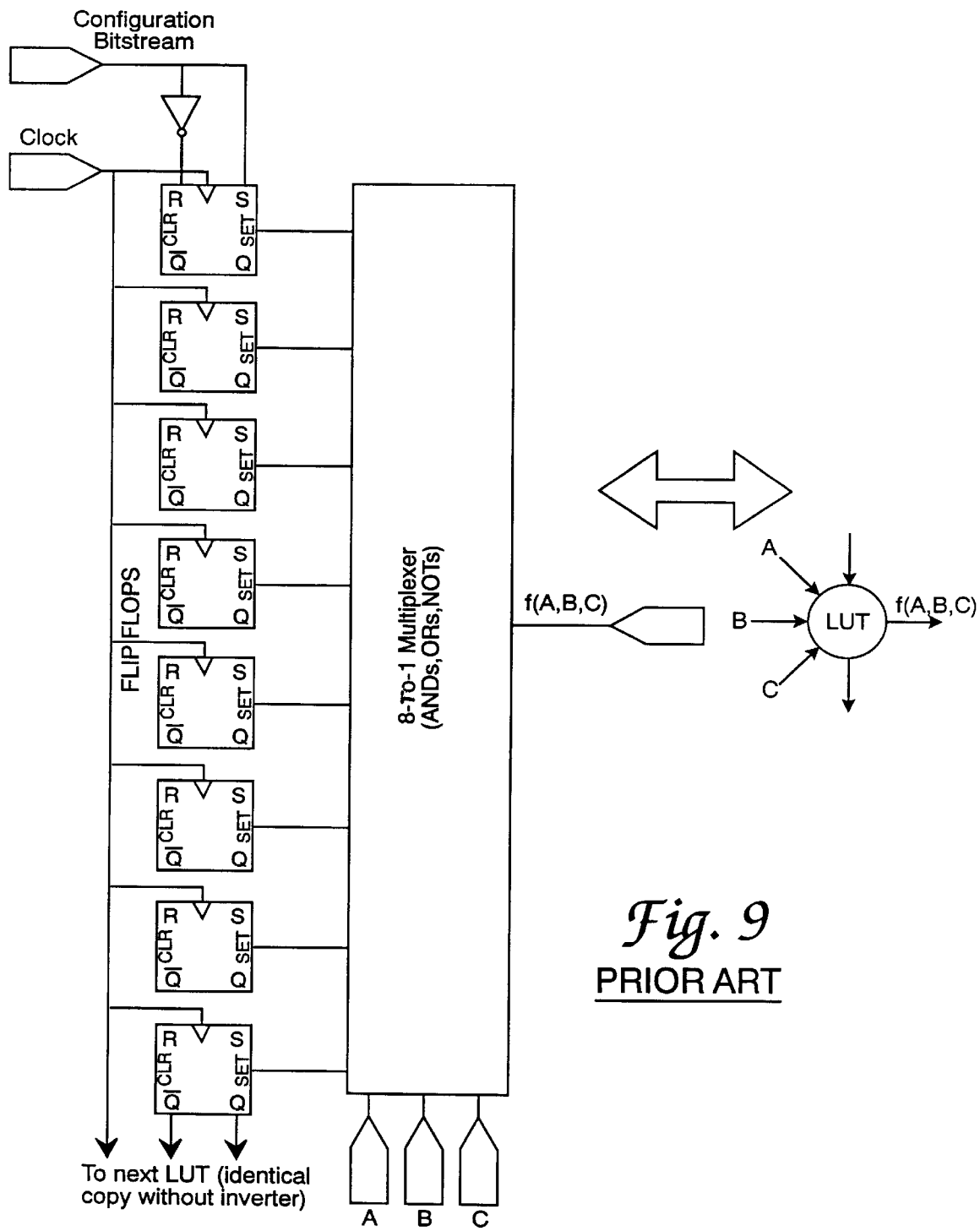
FIG. 9 is a static flip-flop circuit emulation of a single universal, three-input Boolean look-up up table.

This architecture is comprised of one or more large planar (x, y) arrays, each array consisting of identical building blocks that each implement a single universal, three-input Boolean look-up table (LUT). LUTs are a well-known construct to the designers of VLSI field programmable gate arrays (FPGAs). The m-LUT is designed to implement any possible function of m Boolean input variables. In the case of the 3-LUT, an eight-bit memory (static flip-flop circuits, see FIG. 9) that is programmed serially during initialization is sufficient to represent any Boolean function of three variables ($2^{\wedge}=8$). By using the three Boolean variables to control of an 8-input multiplexer (built of molecular scale AND, OR, and NOT gates) and storing one bit of an overall pattern in each input location, exactly one bit of the 8-bit pattern is selected. Since all possible input variations are covered by exactly one output, which can be arbitrarily defined, this LUT universally implements any of the 256 possible Boolean functions of three inputs ($2^{\wedge}2\ 3=256$).

It is important to understand the power and flexibility of the LUT, as it enables the construction of a universal computing fabric. A simple Karnaugh map (k-map) representation of three Boolean input variables reveals how eight bits can represent a three-input Boolean function. In the simple example shown in FIG. 10, a Boolean function f=ABC'+ABC+A'BC=AB+BC is represented. The terms ABC',ABC, and A'BC are called minterms or implicants, and represent the "cover" of ones, or the specific cases where a non-zero behavior results. Clearly, only three cases exist where the function f has the behavior of one. By Boolean algebra, the equation ABC'+ABC+A'BC reduces to a simpler form AB+BC.

A simple analogy can be formed between cellular automata and LUTs. Cellular automata (CA) are simple regular structures that can be thought of as a periodic lattice in space. It is possible to discuss multi-dimensional CAs, but this discussion will presently only focus on one-dimensional CA structures, which can be thought of as a linear array. An individual site is referred to as a cell, and a specific set of one or more cells is referred to as a CA structure. CAs, by virtue of this periodic linear arrangement, are discrete in space. They are also discrete in time, that is, each cell has a value or state that is fixed at each time instant, and time behavior proceeds in discrete intervals. This discussion will further be restricted to binary CA structures, which may only take on the values of "0" or "1" at each cell location.

Figure 11:
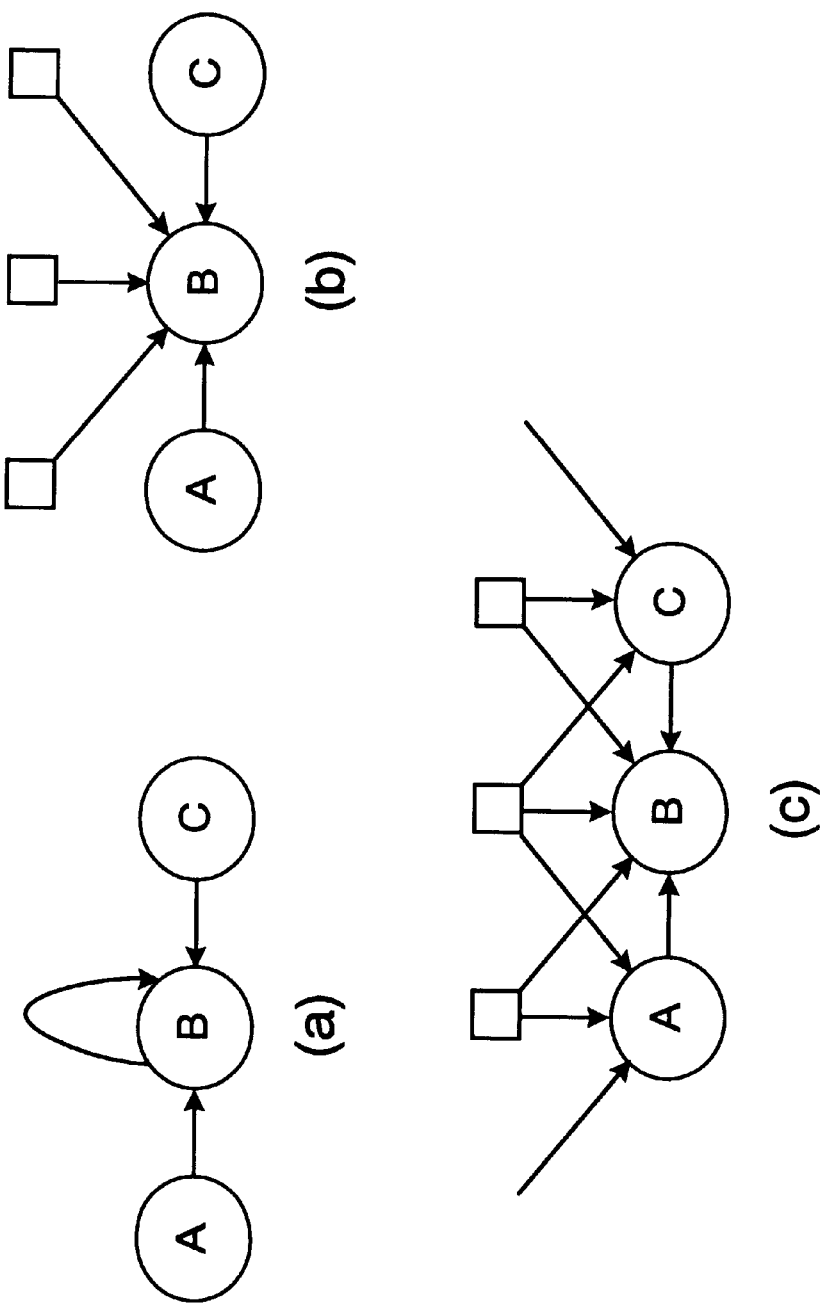
FIG. 11 comprising of FIGS. (a), (b), (c) and (d) is a one-dimensional (1-D) binary CA structure that has a neighborhood of three.

The behavior of CAs is simple and completely characterized as a function of cells in a neighborhood about each cell in an array. This discussion will focus momentarily on one-dimensional (1-D) binary CA structures that have a neighborhood of three. Such a CA is shown in FIG. 11, with a close-up depicting the neighborhood about a single cell. In FIG. 11, cell B has a neighborhood of three cells, which is defined to include the cell itself ("B") and its two nearest neighbors ("A" and "C"). (It is equivalent to state that this description is of a 1-D CA with neighborhood radius r=1). In other words, the next state of "B" depends upon (and only upon) the present state values of "A", "B", and "C". In CAs, it is customary that this neighborhood relationship be true of all cells in the CA structure. In other words, all cells have identical neighborhood arrangements, where each cell's next state depends upon only itself and its two nearest neighbors.

Figure 12:
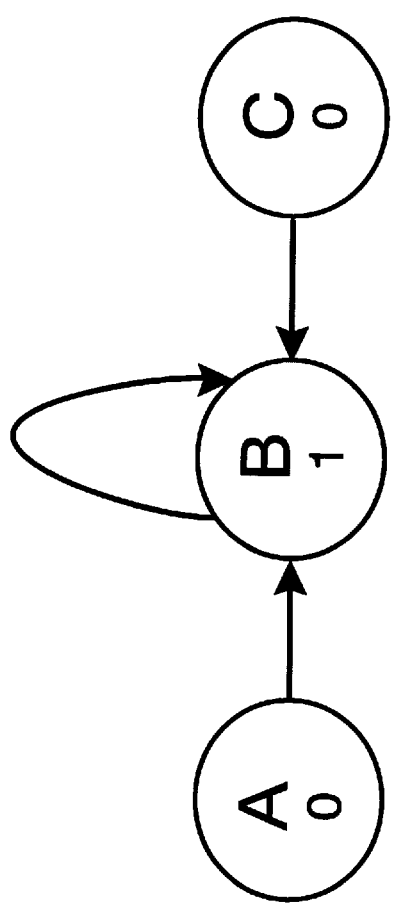
FIG. 12 is an example rule for a 1-D binary CA with neighborhood three.
Figure 12:
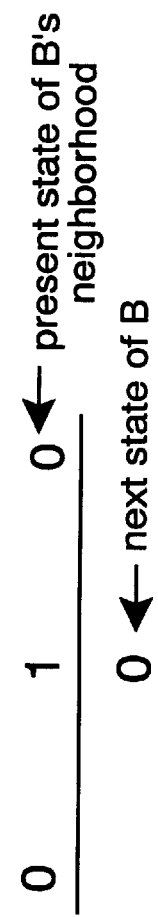

The behavior of CAs is completely governed by a set of local rules that prescribe the next state of a cell as a function of a cell's neighborhood. This behavior is customarily indicated upon all cells in a given CA structure. In other words, all cells in a CA obey identical local rules (this restriction will soon be lifted as a fundamental extension of the basic concepts). An example rule for a 1-D binary CA with neighborhood three is shown in FIG. 12. The cell "B" is shown to have a present state of "1", and its nearest neighbors "A" and "C" have present states of "0" and "0". This neighborhood, then, is said to have the state "010", and a rule can be established for "B" when the neighborhood has this value. The rule shown in FIG. 12 is that when the present neighborhood is "010", the next state of "B" is "0". This local rule is based on one possible neighborhood state. Since the CA is binary with neighborhood size of three, then it is possible to completely specify the behavior of the CA with eight ($2^{\wedge}3$) local rules, corresponding to vertices of the binary state space of three variables: "000", "001", "010", "011", "100", "101", "110", "111".

Figure 13:
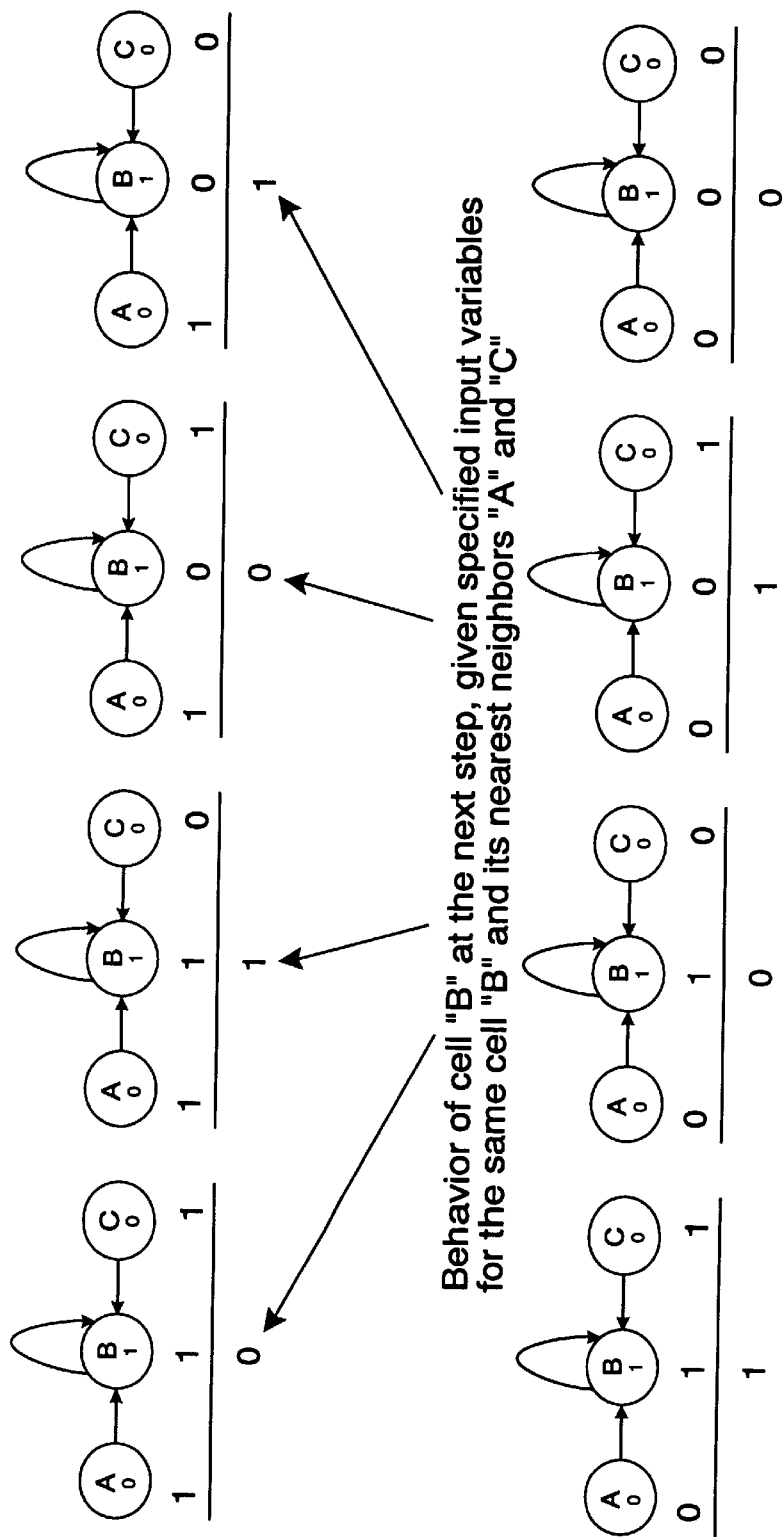
FIG. 13 shows an example of a complete local rule set specification.

An example of a complete local rule set specification is shown in FIG. 13. Here, all eight local rules are specified. As this rule set is a complete characterization for a 1-D binary CA with neighborhood size 3, it is possible to observe a very compact specification of behavior. Since each neighborhood state corresponds to a single binary digit, it is possible to use a juxtapositional notation involving a binary number of eight digits or positions, with each position corresponding to a particular neighborhood state. In the normal expression of numerals in the binary system, a number such as "1100" corresponds to a compact notation for $1 \times 2^3 + 1 \times 2^2 + 0 \times 2^1 + 0 \times 2^0$, also known as the decimal number "12". By realizing that the neighborhood states "000" through "111" are equivalent to the decimal numbers 0–7, and using an eight-digit binary representation: $r_7\ r_6\ r_5\ r_4\ r_3\ r_2\ r_1\ r_0$ where each numeral $r_i$ represents the rule for a particular neighborhood state i (from the range 0–7), then the entire CA structure can be specified by a single number within the range 0–255. The specification for each $r_i$ is given by the value of the rule for the ith neighborhood state. The number is also referred to as a rule, but a global rule, based on this juxtaposed composition of all local rules.

The progression is more easily illustrated than described. In the FIG. 12 example, the entire local rule set is captured as follows: "111"="1"; "110"="1"; "101"="0"; "100"="0"; "011"="1"; "010"="0"; "001"="0"; and "000"="0". Now, exponentiate each rule as a power of two, corresponding to the neighbor state value, and associate this value to the corresponding rule as follows: $2^7 \rightarrow$ "1", $2^6 \rightarrow$ "1", $2^5 \rightarrow$ "0", $2^4 \rightarrow$ "0", $2^3 \rightarrow$ "1",$2^2 \rightarrow$ "0",$2^1 \rightarrow$ "0",$2^0 \rightarrow$ "0". Finally, convert this association to a traditional binary number in a juxtaposed representation in which the exponents are implied: "11001000", which is equivalent to the decimal number "200". This number is called the "rule number" or rule (global) of the CA.

Hence, the behavior of any 1-D binary CA with neighborhood size three can be represented as a single number whose value is between 0 (the binary number "00000000") and 255 (the binary number "11111111"). This numeric "trick" can be easily applied to binary CAs of any neighborhood size. For a CA with neighborhood m, the number of local rules is $2^m$, and the corresponding rule is a decimal number between 0 and $2^{\wedge}(2^m)$. For m=4, the neighborhood is 4, the number of local rules is 16, and the compressed scalar number (rule number) that uniquely codifies behavior is a decimal between 0 and 65,536 ($2^{\wedge}2^{\wedge}4$).

Figure 14:
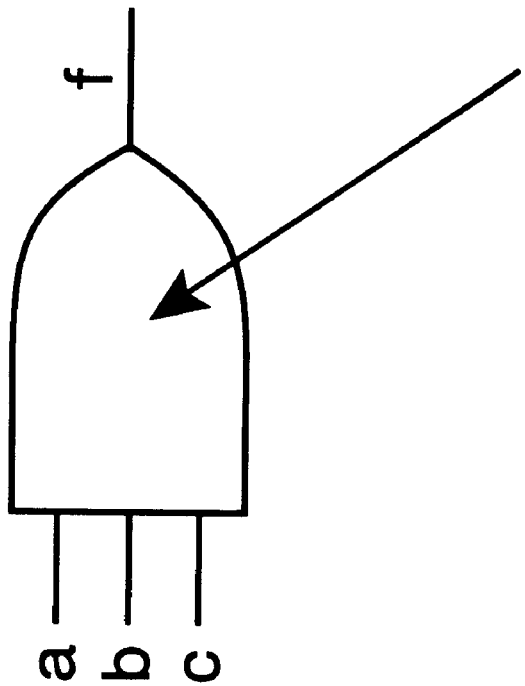
FIG. 14 is a three input AND gate with the expected truth table demonstrating the simple correspondence between Boolean functions of m variables and a binary CA of m variables.

Next, we establish a simple correspondence between Boolean functions of m variables and a binary CA of m variables. It is simple enough to say that any Boolean function of m variables identically defines a truth table of m variables that is equivalent to a particular CA of m neighborhood. In a simple example, FIG. 14, a three input AND gate is shown with the expected truth table. By inspection, we observe that this is simply a binary, 1-D CA of neighborhood 3 and rule number =#128. (In the jargon of CAs, this behavior has only one non-trivial local rule, 111, which in our notational discussion is related to $2^7=128$.). Another way of looking at the analogy between Boolean functions and CAs is that each entry of the truth table is exactly equivalent to one local rule of a CA.

Finally, we relate the m-variable LUT (m-LUT) as a universal CA of neighborhood size m. If any Boolean formula of m variables can be correlated to a particular CA of neighborhood m, then because an LUT can customize each truth table entry, this action is equivalent to being able to customize each (and every) local rule of a CA of neighborhood size m. We propose a simple definition of a universal CA as being a CA whose local rule set can be defined arbitrarily. Any global CA rule can be directly implemented as an LUT whose number of inputs corresponds to the neighborhood size. Therefore, an LUT of m variables defines a universal CA of neighborhood size m.

Figure 10:
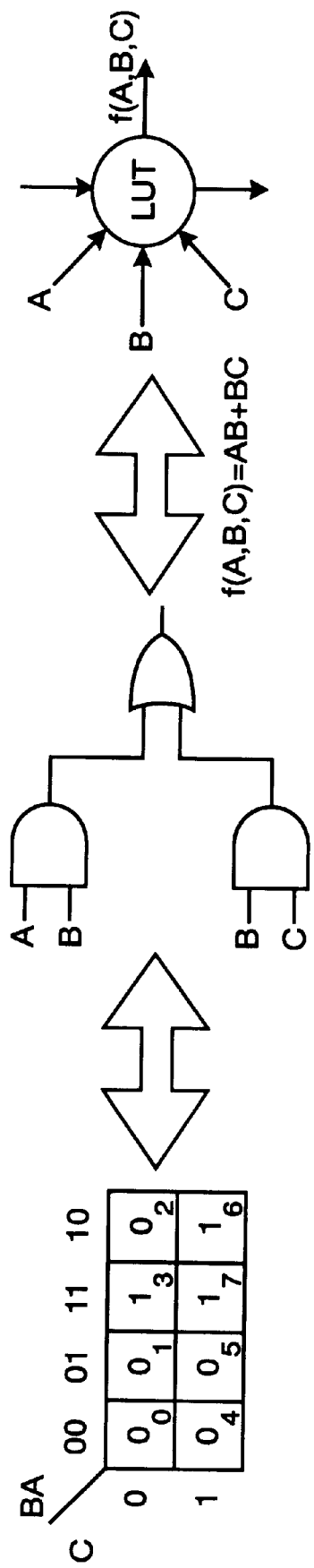
FIG. 10 is a k-map representation of three Boolean input variables.

Using the equivalence of cellular automata and LUTs, the Boolean function of the example in FIG. 10 can be represented by the juxtapositional representation of eight binary digits (e.g., 01001100, 11111101, etc.) where each digit represents the functional outcome of a particular point in "Boolean space." The eight bits, which completely specify any conceivable 3-input Boolean function (inputs A, B, and C), can also be represented in decimal. In this example, $f(A,B,C)=2^3+2^6+2^7=200$, which unambiguously specifies $f(A,B,C)=AB+BC$.

Figure 15:
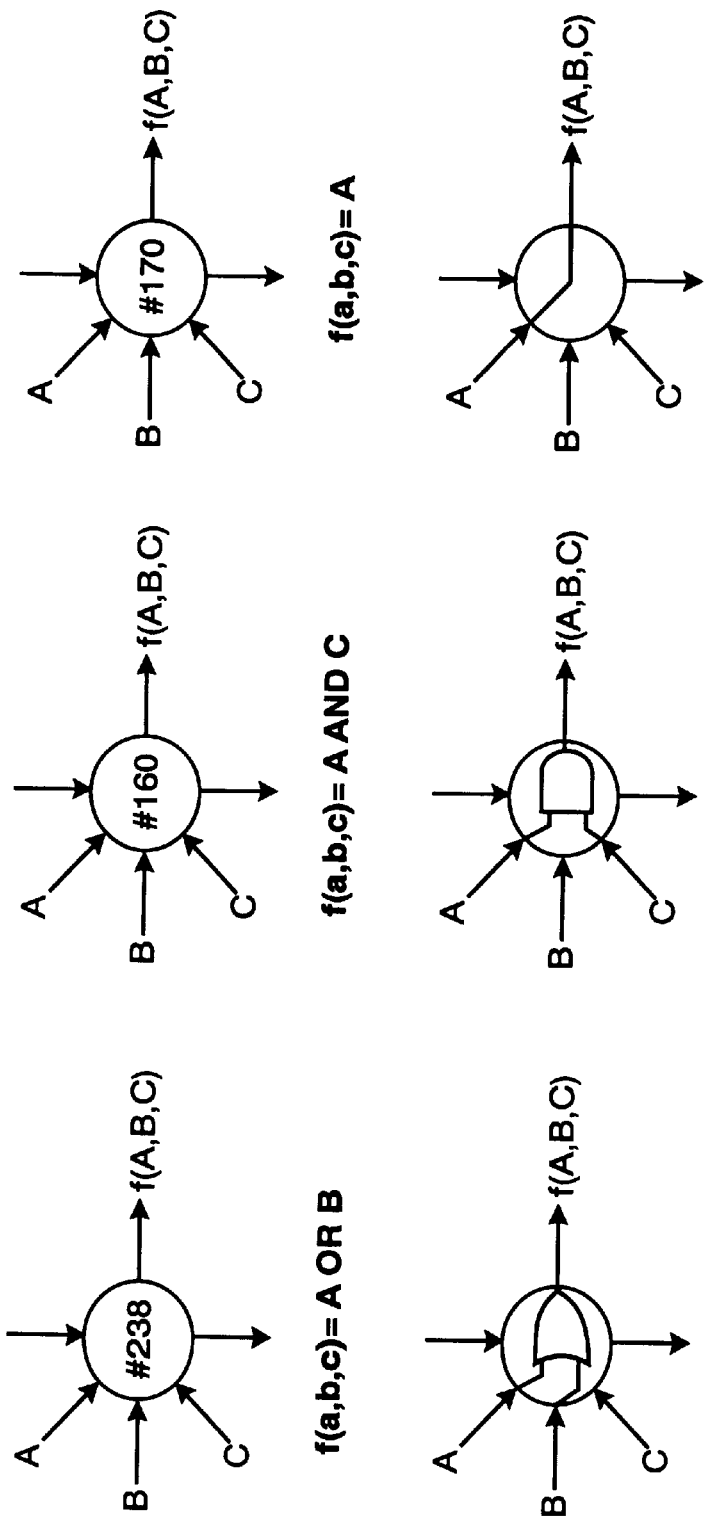
FIG. 15 shows other sample Boolean finctions.

Other sample Boolean functions are shown in FIG. 15 for a 3-input LUT (3-LUT) case. Not only can traditional functions be implemented, but the LUT can also be used to emulate wires. For example to connect input A to the output f, one needs only specify the behavior f(a,b,c)=A=#170. This latter feature is essential to the subsequent discussion on the construction of homogeneous logic arrays that can compute more complex functions.

It is obvious that the examples in FIG. 15 could be expanded for 4-input, 5-input, etc. LUTs. The extension does require extending the numbering system to a higher number of possible functions ($2^2{}^\wedge m$ for m inputs), but follows otherwise directly the same implementational possibilities.

An important and novel feature of the proposed LUT-based computer architecture is in the connection topology, which is based on studies by Wolfram in the propagation of one-dimensional binary cellular automata [Wolfram, Stephen. Cellular Automata and Complexity. Addison-Wesley, New York (1994)]. Here, we extend the concept to circuit connection topologies, resulting in a homogeneous reconfigurable gate array (see FIG. 16). This array is based on an x,y arrangement of 3-LUTs, and in principle can be extended to any m-LUT arrangement, where m is an odd integer (e.g., 5,7,etc.). This array is referred to hereafter as a tile of what will later be shown to be a molecular field programmable gate array (MFPGA). As we have established the equivalence between cells in a CA and logic gates, in particular between their most general representations (i.e., the universal CA and the look-up table), then it is a simple matter to relate the topologies of CAs to the topologies of circuit networks. The LUT-based equivalent of the 1-D binary CA is established by "unraveling" the temporal behavior of the CA in a linear grid into a propagating behavior in a two-dimensional mesh. This simple procedure is illustrated in FIG. 17. Here, the neighborhood of cell "B" (FIG. 17a), which provides the feedback to "B" for generating its next state behavior, is broken out into connections that depend on the results of other cells (FIG. 17b). As it turns out, these cells are simply identical copies of the 1-D CA, which impresses the state behavior from the last discrete time step onto the current row, which then computes the next state behavior. Similar connections occur for all neighboring cells (FIG. 17c).

Rather than directly implement the feedback behavior of 1-D CAs, the 1-D CA network is unfolded or converted spatially into a 2-D feedforward network that is the heart of a molecular field programmable gate array (FIG. 16) structural concept. Descriptively, the architecture is still classified as a 1-D architecture, but this implementation is obviously two-dimensional in space.

Figure 16:
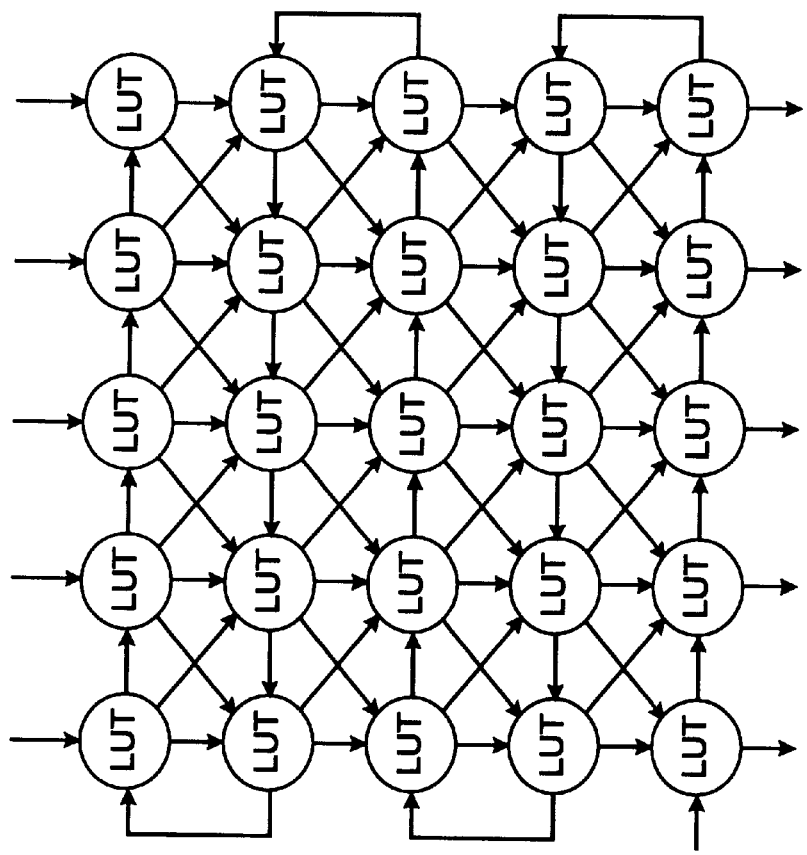
FIG. 16 is an array based on 3-input lookup tables or tile.
Figure 16:
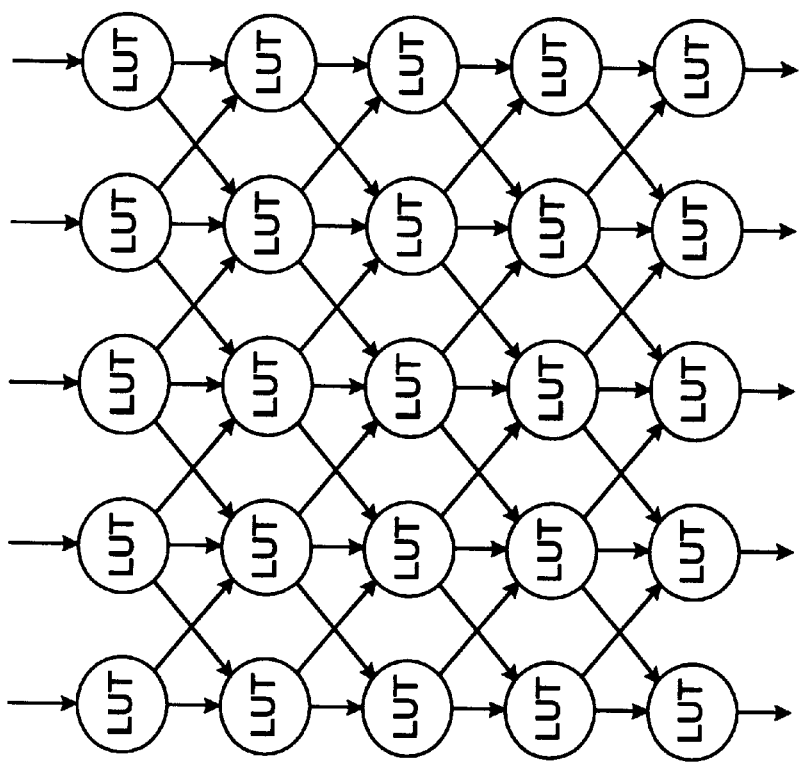
Figure 17:
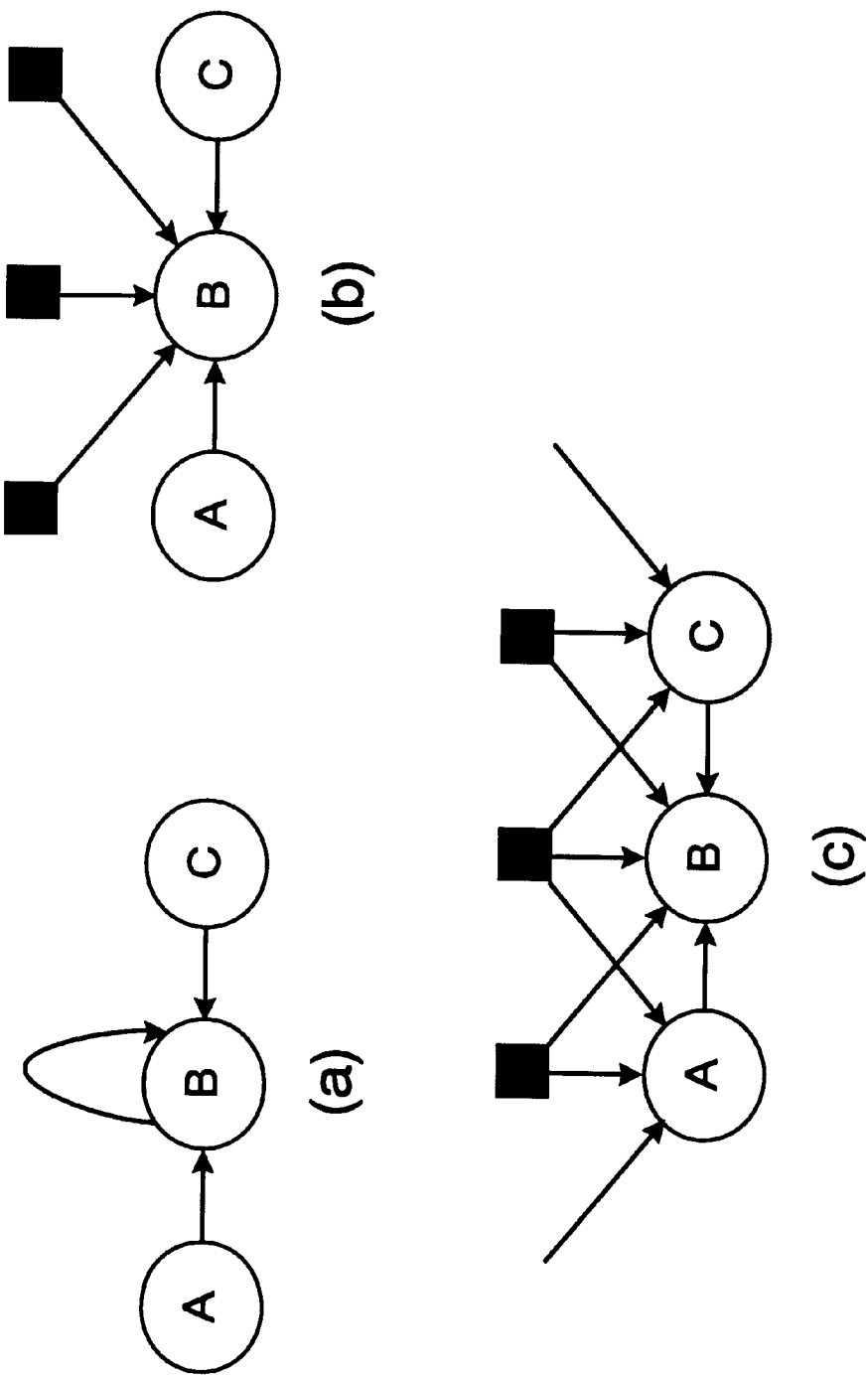
FIG. 17 comprising of FIGS. (a), (b) and (c) shows the temporal-to-spatial conversion of a 1-D CA into a 2-D structure.

Now, we provide a more concise description of the FIG. 16 tile. It is a tile of 3-input LUTs, with a neighborhood template defined as follows: the value of the ith cell of the jth row for the FPGA will depend on the ith, (i−1)th, and (i+1th) cell of the (i−1)th row (j increases in the direction of propagation), this mapping being a direct consequence of the fact that the FPGA architecture of claim 1 maps the temporal feedback dependencies of the corresponding CA 1-D architecture onto a spatial feedforward network.

The tile is large planar (x-column, y-row) tile of identical cells, each cell implementing a single, universal 3-input Boolean look-up table with six non-redundant, non-power terminal connection patterns per LUT, each LUT being allowed to be distinct and individually programmable for a particular logic function or for routing from external inputs or outputs, the last row of periodic LUT tiles being terminated in a linear array of registers, and side coupling being permitted between tiles. The tile contains periodic wire input/output attachments to any side of tile or register array termini, subject to cone of influence effects. As will be discussed further, the reconfigurable nature and regular structure of the FPGA provides a means to test each tile to locate defective LUTs. If defects are found, as will be discussed, the ability to alter behavioral specifications of any LUT in a tile suggests a means for mapping around a finite number of defective LUTs.

Figure 18:
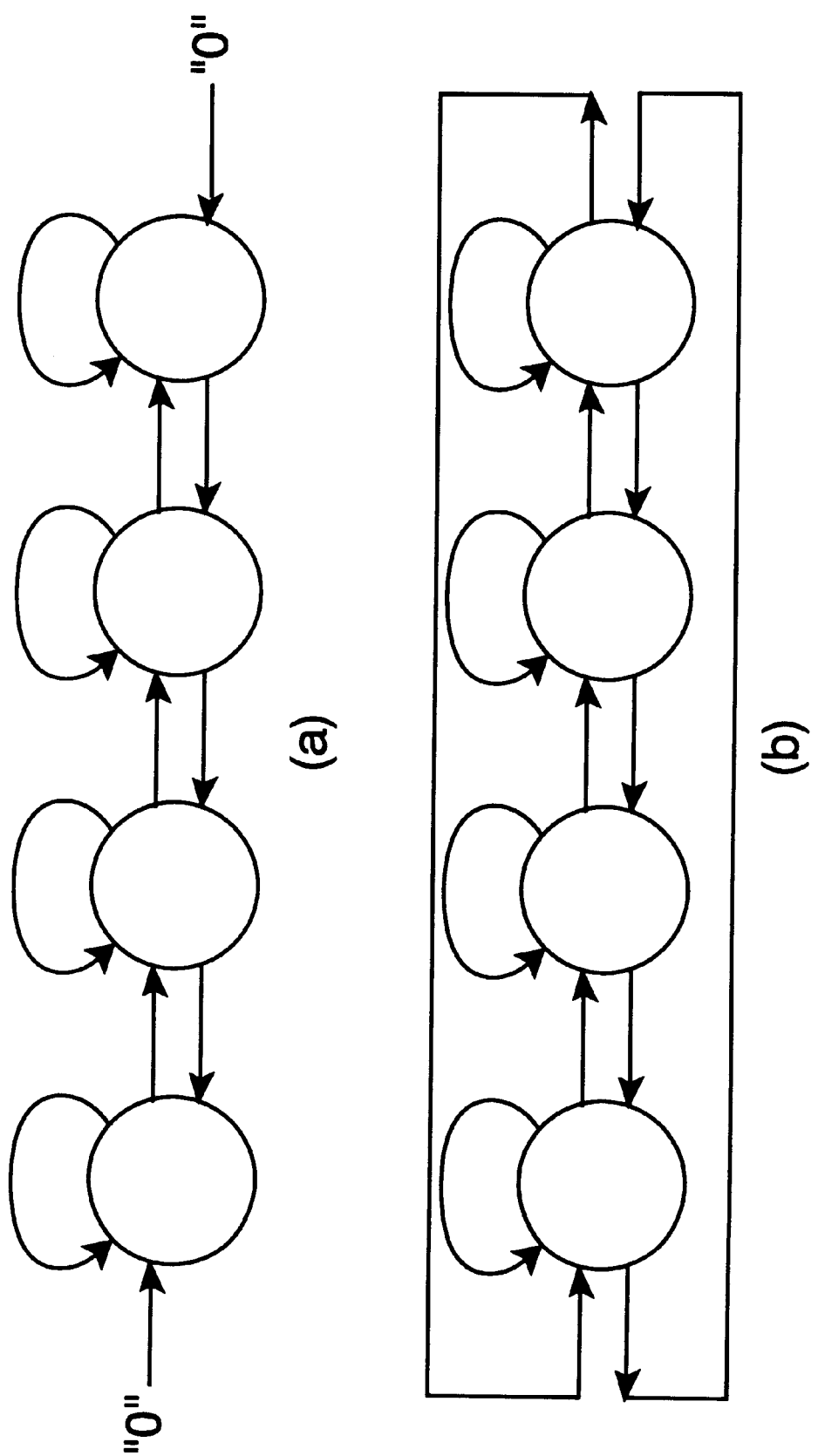
FIG. 18 comprising of FIGS. (a) and (b) illustrates null and periodic (circular) boundary conditions as applied to 1-D CAs.
Figure 19:
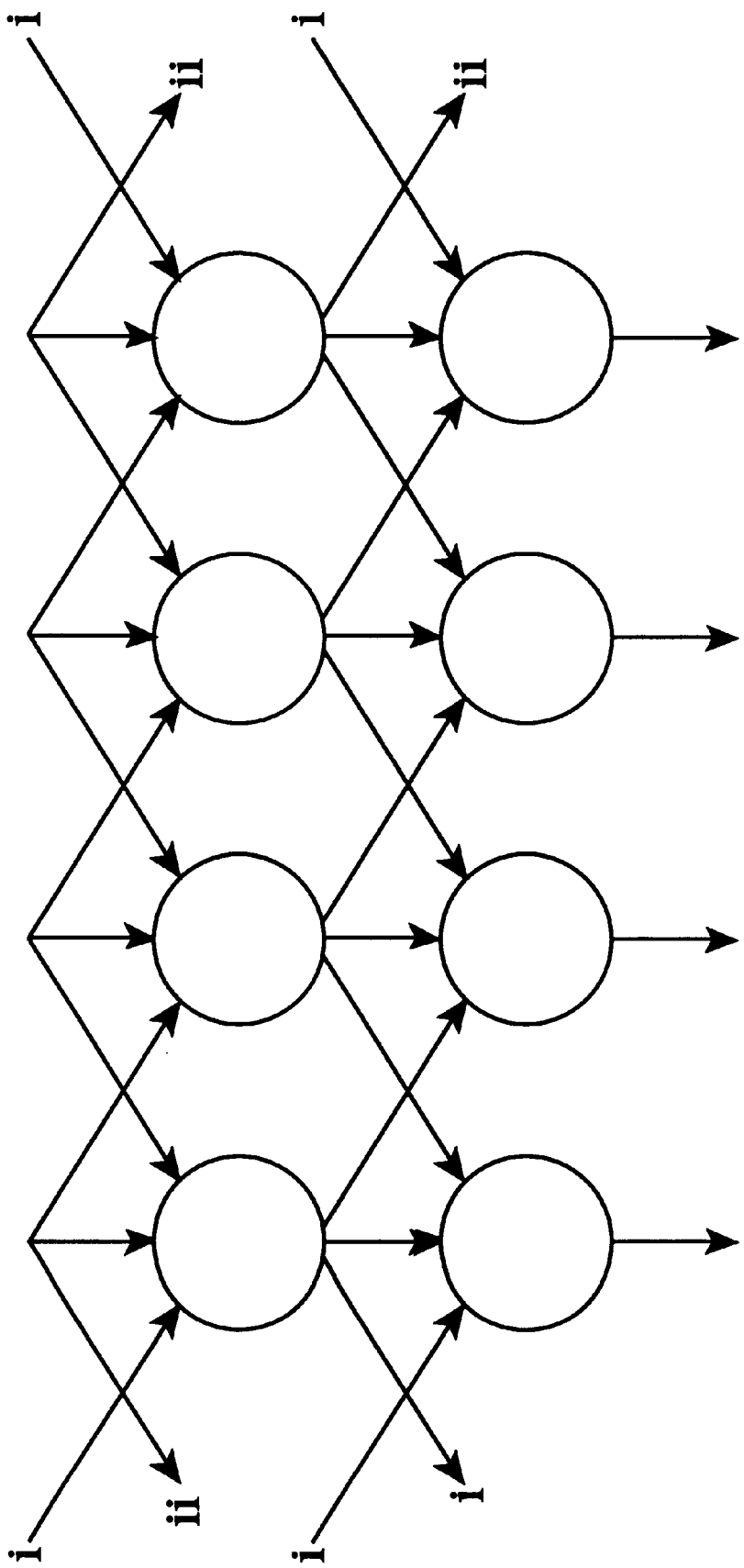
FIG. 19 shows to types of dangling bonds in a tile structure.

Next, we discuss the end cell boundary conditions of the 1-D CA network and the corresponding relationship to the 2-D feedforward analogy in the MFPGA tile. In 1-D CAs, the treatment of the first and last cells can result in different behaviors in the CA over time. According to Pries et al., two cases exist for 1-D CA structures, illustrated in FIG. 18. In FIG. 18(a), the left neighbor of the first cell and the right neighbor of the last cell are terminated in logical "0". This case is referred to the null boundary CA case. In FIG. 18(b), on the other hand, the left neighbor of the first cell is connected to the right neighbor of the last cell of the 1-D CA structure. This case is referred to as the periodic (circular) case. [Pries, W. et. al. "Group Properties of Cellular Automata and VLSI Applications", IEEE Transactions on Computers, volume C-35(12), December 1986.] In the "unraveled 2-D feedforward network "that forms the basis of the molecular FPGA, it is straightforward to implement equivalent cases. It is more useful, however, to further examine the ends of the sides of the MFPGA tiles, as shown in FIG. 19. Here, in the basic structure of a tile we find that unterminated side ends form the analogy of "dangling bonds", a feature that becomes useful later in the consideration of a more complete architecture. The "dangling bonds" come in two types. Type "i" (see FIG. 19) "dangling bonds" are uncommitted inputs, whereas type "ii" inputs are uncommitted outputs. These dangling bonds become useful in more complex structures, where the previously uncommitted bonds become intertwined (or no longer dangling), permitting useful couplings of signals from other sources into the tile.

Next, we make a very simple intuitive leap, one that is very difficult to do from the vantage of CA behavioral studies, but is quite simple from the perspective of circuit design. Specifically and simply, by allowing the behavior of each cell (or the definition of each LUT) to be distinct, we can then form a basis for a field programmable gate array. Sometimes, in CA research, this approach is equivalent to what is referred to as "hybrid" or "non-uniform" CA structures. In such structures, distinct rules can be assigned to each CA cell.

The tremendous density of molecular electronics will allow the implementation of arbitrary combinational digital circuits by using standard methods in multilevel logic synthesis and technology mapping, in which complex functions are decomposed into logic building blocks, such as LUTs. Ideally, this procedure translates digital circuitry of nearly arbitrary complexity into a particular equivalent connection of some quantity of LUTs. These computer-aided design processes are standard in the development of FPGAs. In the case of traditional field programmable gate arrays, separate algorithms are used to determine translation of the digital circuits into equivalent LUTs (or other building blocks) and the subsequent routing of signals between inputs and outputs of these blocks. In the new MFPGA, however, there is an intimate relationship between the inputs and outputs of each LUT with respect to the routing of signals. Decisions about routing between LUTs cannot be separated from the geometric placement and definition of contents of each LUT that comprises a circuit definition of interest.

Figure 20:
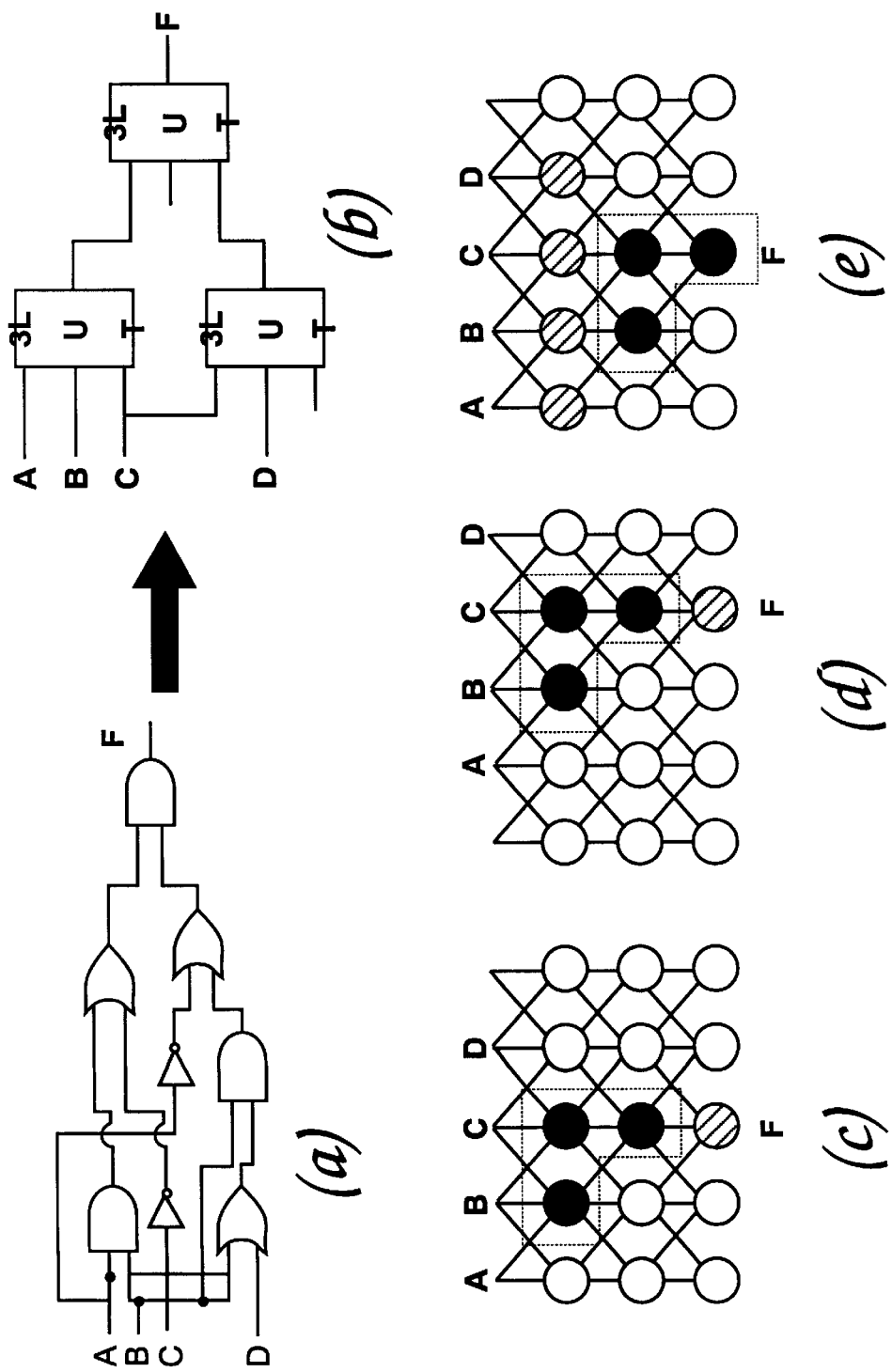
FIG. 20 comprising of FIGS. (a), (b), (c), (d) and (e) depicts an example source digital circuit transformed through computer aided design synthesis into an equivalent implementation that only uses 3-LUT building blocks.

Proper synthesis approaches will produce representations that can be mapped in a relocatable fashion for the MFPGA, if one considers a circuit as being equivalent to a finite number of LUT blocks that can be relocated within a seemingly infinite sea of LUTs. Since all LUTs have identical neighborhood relationships (except for the boundary LUT cells), a cluster of circuitry can be relocated through translation vertically or horizontally within the array, so long as (a) the external inputs and outputs to the cluster can be re-routed and (b) the configuration pattern or bitstream sequence is compensated for the translation. This process is represent schematically in FIG. 20. FIG. 20(a) depicts an example source digital circuit, which is transformed through computer aided design synthesis into an equivalent implementation that only uses 3-LUT building blocks. The associated computer aided design processes used to produce FIG. 20(b) from FIG. 20(a) are referred to as logic decomposition and technology mapping. For the MFPGA, this representation does not capture the geometric constraints imposed by the MFPGA approach, and further computer-aided synthesis processes might produce a specific implementation in an MFPGA tile such as that shown in FIG. 20(c). Here, the LUTs within the 3×5 tile are transparent if not used. A cluster of three solid colored LUTs enclosed by dotted lines represent the core implementation of logic from the FIG. 20(b). Since the output of this cluster does not appear at the output of the tile, it is necessary to "extend" the output using another LUT colored with a hatch pattern that serves as a route-only LUT. The route-only LUT simply passes the results of a single input from the previous row in the tile to the next row of the tile.

In the proposed architecture, routing is indistinguishable from logic, which affords new dimensions of flexibility. As this architecture was conceived of for molecular level implementation, the relatively inefficiency of using logic for routing is potentially more than compensated for by the sheer density of LUTs that could be implemented. Two other functionally identical implementations of the same logic cluster within the 3×5 tile are shown in FIGS. 20(d)–(e). These implementations demonstrate the translation principle indicative of the MFPGA approach. In each case, the number of LUTs required to implement the FIG. 20(a) function are the same, but additional LUTs may be sacrificed to provide the necessary routing from external inputs or outputs.

The technique through which this architecture can be configured is referred to with several terms, such as "personalization" or simply "configuration". The act of installing the personalization, similarly, is called configuration or personalization. In the industry, RAM-based FPGAs are personalized through a serial bitstream, which is a serial sequence of binary information. A crude analogy is that the FPGA is like a blank state, and the bitstream is the "DNA" which gives the particular FPGA its personality. Changing the bitstream (DNA) changes the personality. Similarly the proposed architecture employs bitstreams for configuring or personalizing each LUT, and until personalized, the LUTs will have an indeterminate pattern. The bitstream may in fact be implemented in the present architecture as an internal shift register.

Figure 1:
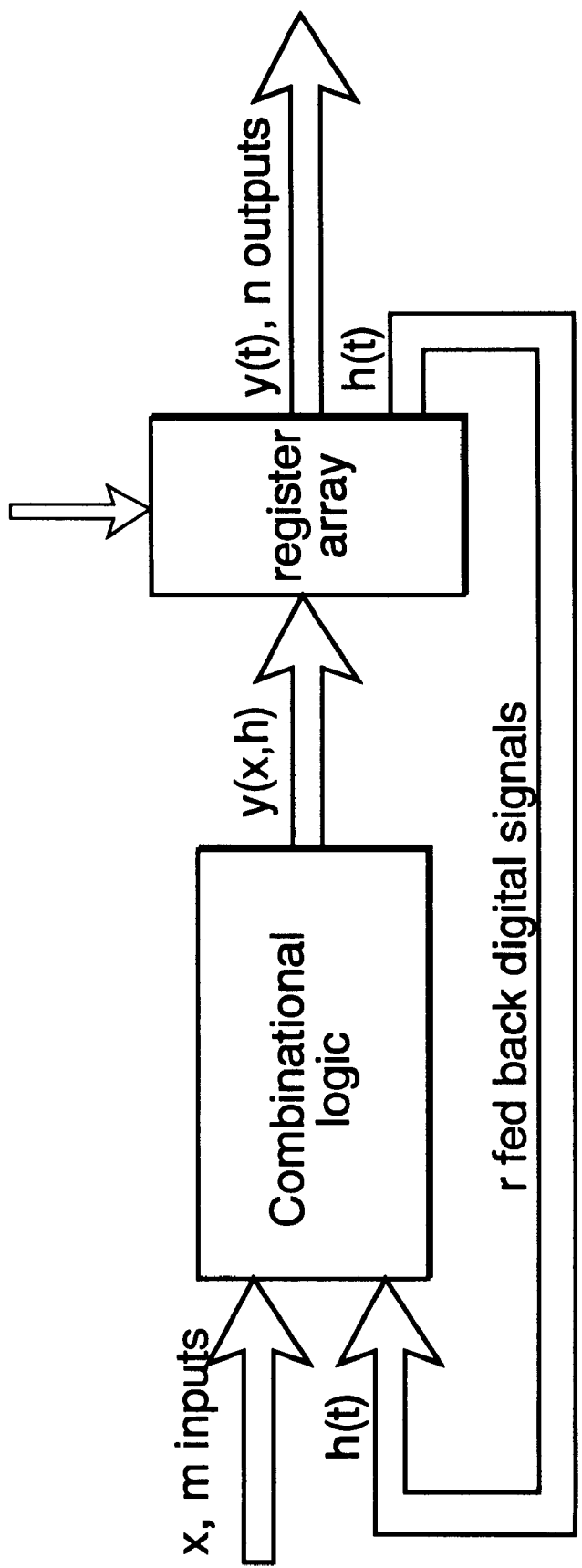
FIG. 1 is a general representation of digital systems.
Figure 2:
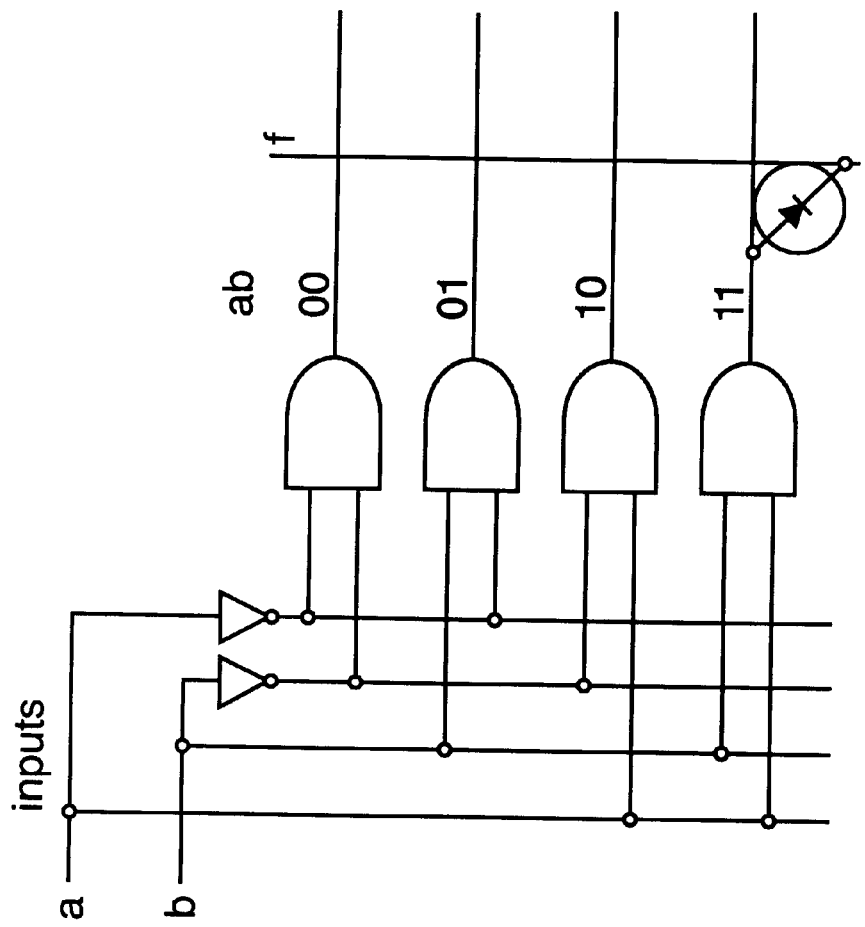
FIG. 2 comprising of FIGS. (a), (b) and (c) shows a typical simple logic gate and how to implement the equivalent finction using a simple (diode-based) memory array.
Figure 3:
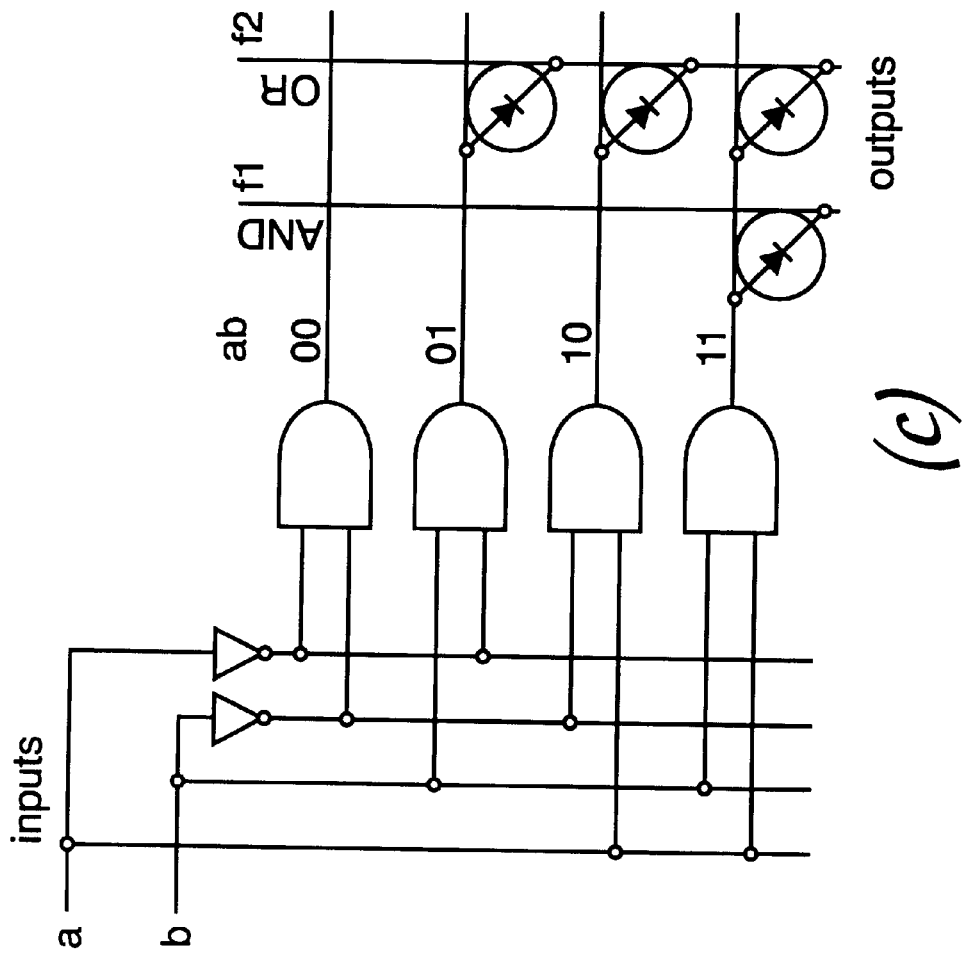
FIG. 3 comprising of FIGS. (a), (b) and (c) shows an extension of the memory array to handle several finctions of the same input variables.
Figure 3:
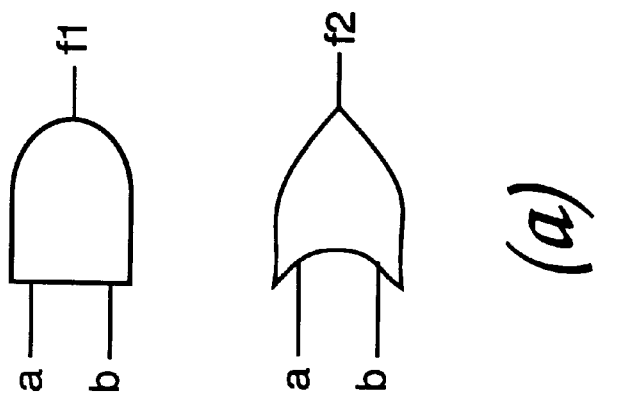
Figure 4:
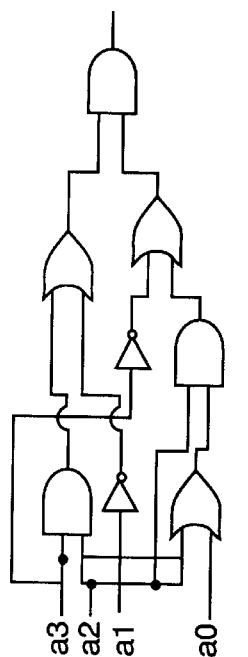
FIG. 4 comprising of FIGS. (a), (b), (c) and (d) provides more examples of memory arrays, illustrating how memories can be equivalent to a look up table (LUT).
Figure 4:
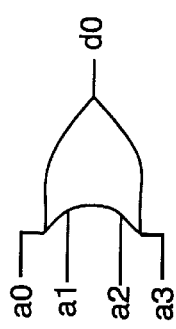
Figure 4:
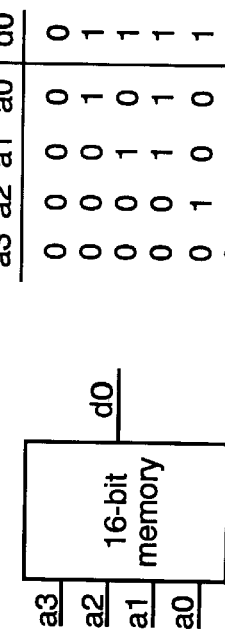
Figure 4D:
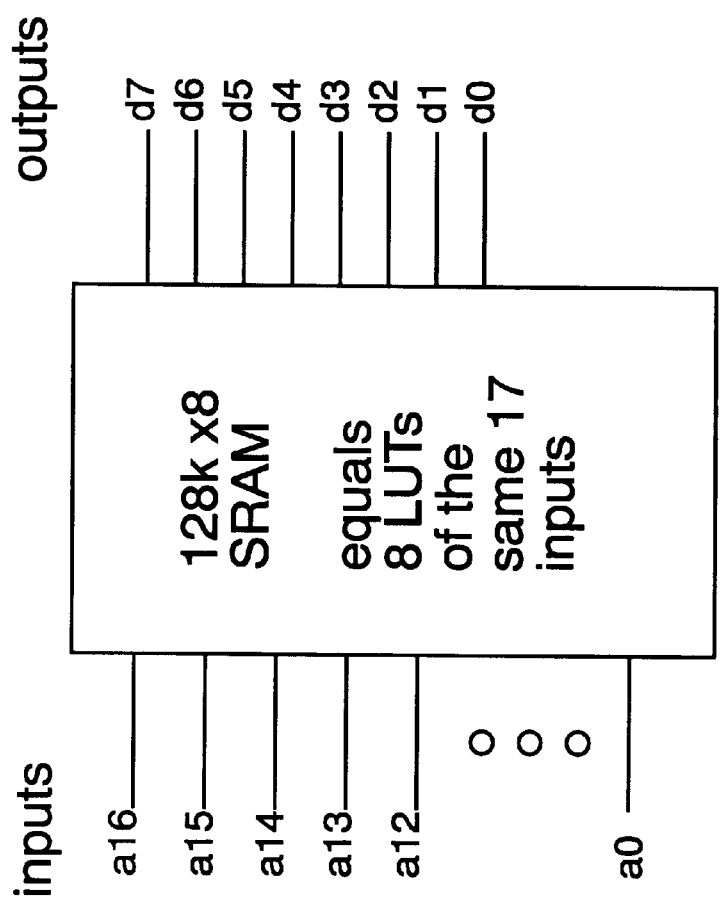
Figure 5:
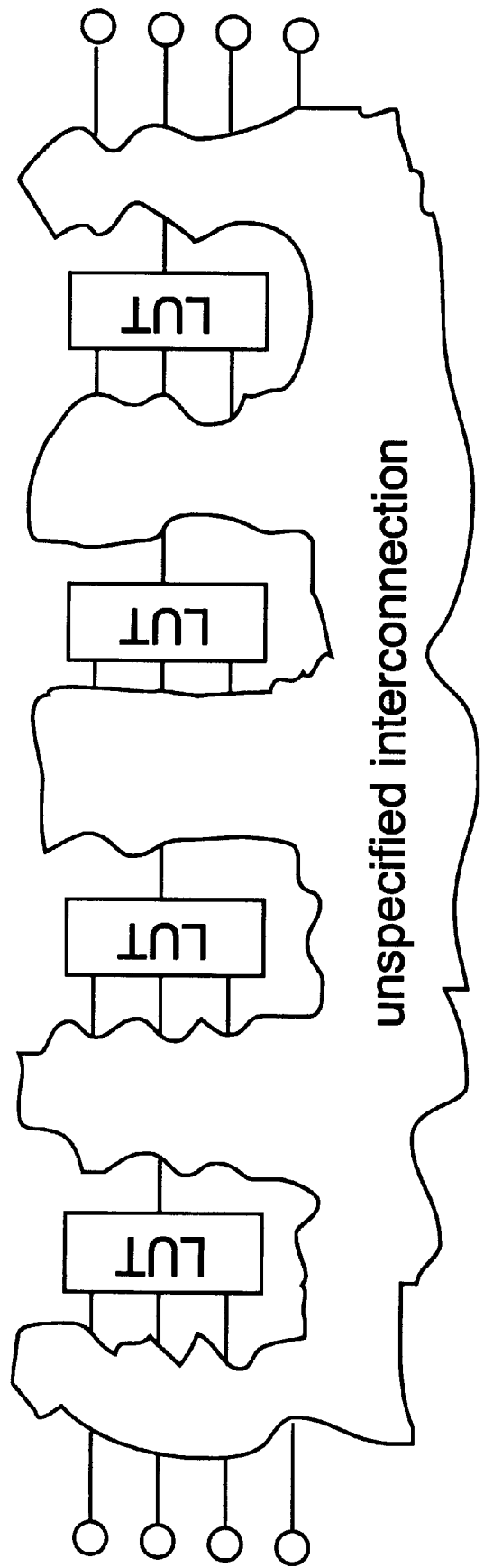
FIG. 5 shows how digital logic could be implemented using a number of simple LUTs with an unspecified interconnection fabric.
Figure 6:
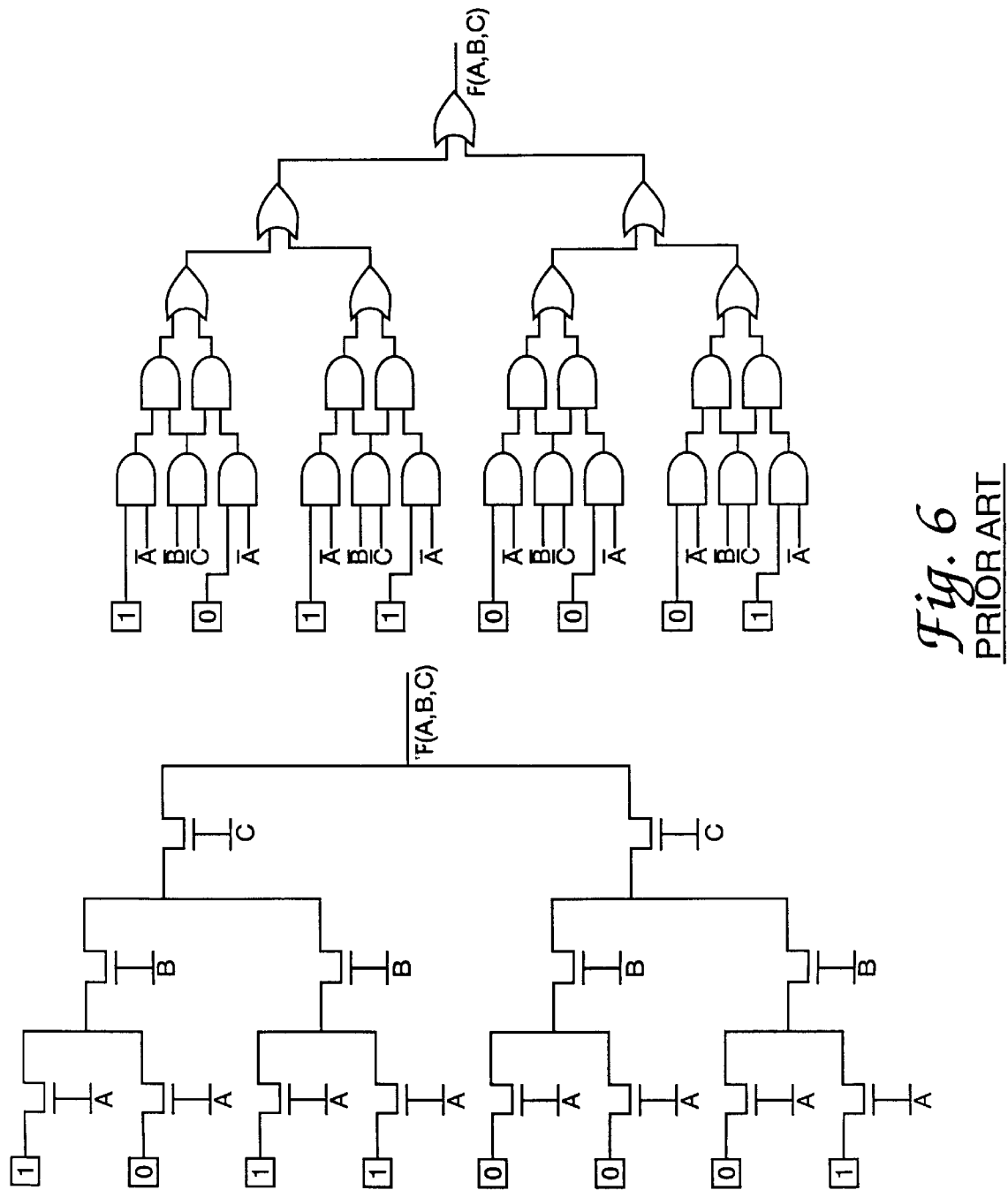
FIG. 6 shows two implementations of a 3-input look-up table (3-LUT).
Figure 7:
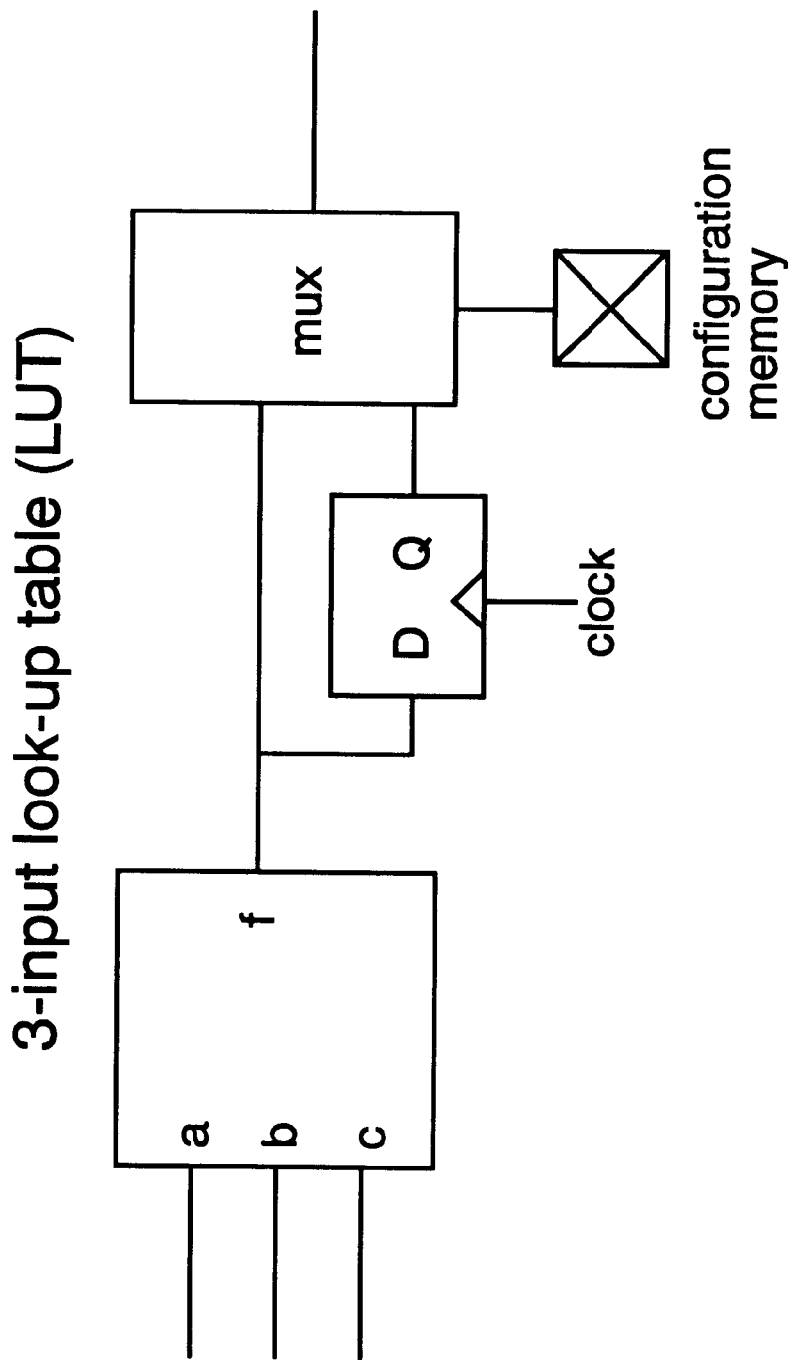
FIG. 7 shows a technique for combining storage with look-up tables in an FPGA architecture to create sequential behavior (LUTs only implement combinational behavior).
Figure 8:
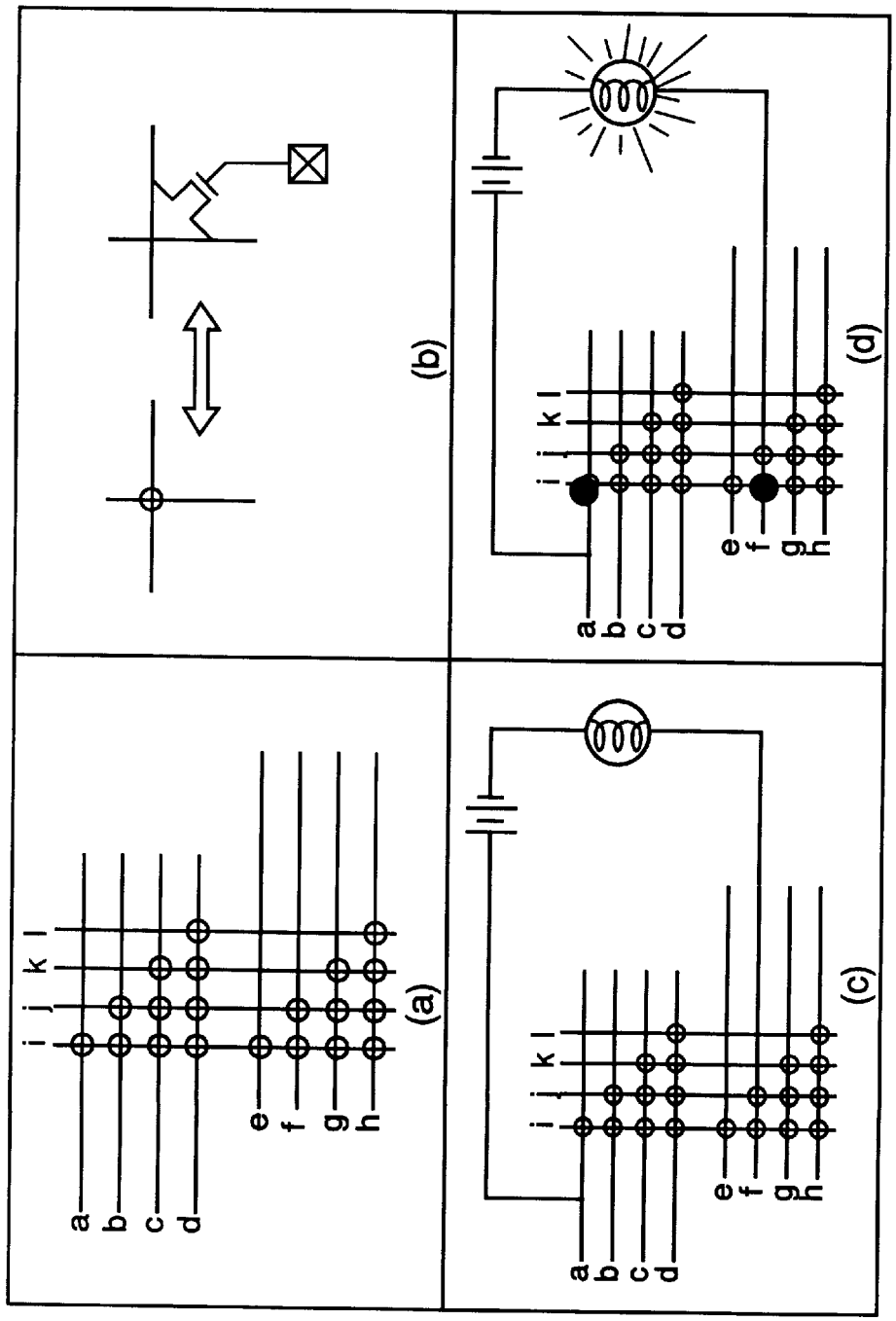
FIG. 8 comprising of FIGS. (a), (b), (c) and (d) is a sample routing fabric for a typical FPGA.
Figure 21:
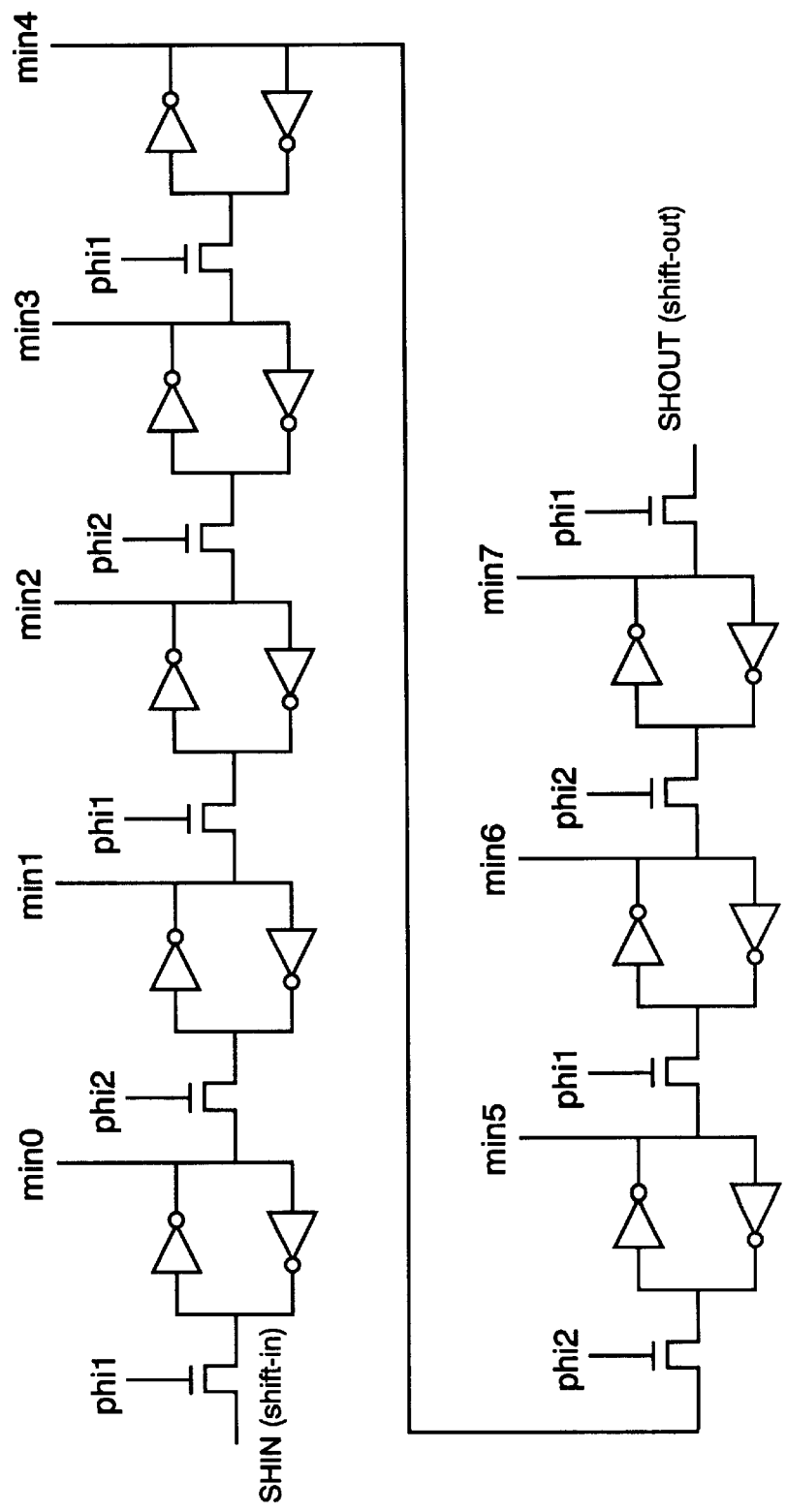
FIG. 21 depicts a silicon VLSI implementation of a shift register that relies on a non-overlapping two-phase clock.

FIG. 21 depicts a silicon VLSI implementation of a shift register that relies on a non-overlapping two-phase clock. It is straightforward to show that the FIG. 21 implements a four-bit shift register through simulation or construction, and many alternative implementations can be conceived. For the proposed architecture, the shift register would implement $2^m$ bits, where m is the number of inputs. The shift register is easily related to the FIG. 6 implementation of the 3-LUT, by replacing the series of boxes (on the left of FIG. 6 that contain a "1" or "0") with a shift register structure. FIG. 6 shows a 3-LUT separate from how the "1"s and "0"s are generated. The requirements, then, for each LUT of the proposed architecture are that additional terminals be added to each LUT, consistent with the design of the shift register. For example, a minimum set of termini would likely consist of three termini: (1) shift-in, (2) shift-out, and (3) clock. Such an implementation is suggested in FIG. 9. If a molecular implementation requires regeneration of the clock, then an additional terminal is required. If furthermore, a multiphase clock is required in the shift register implementation (two-phase and four-phase clock schemes are popular in VLSI), then accordingly more terminals are needed to implement the configuration facility within each LUT.

Figure 22:
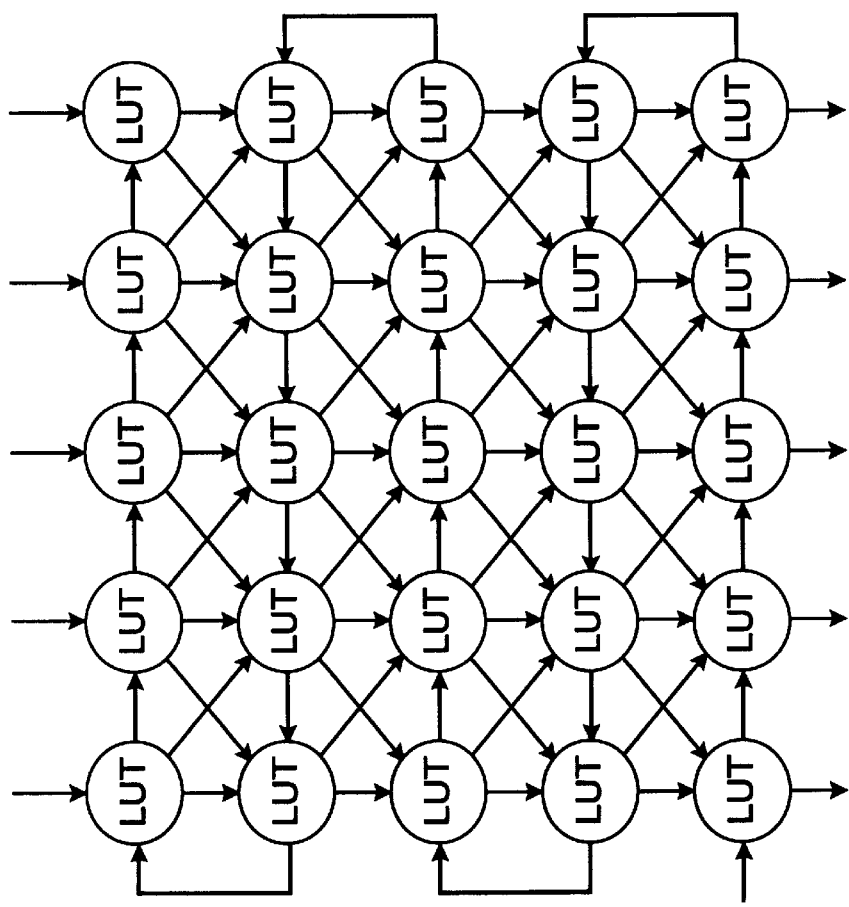
FIG. 22 is an example schematic of how a configuration system is connected between each LUT.
Figure 23:
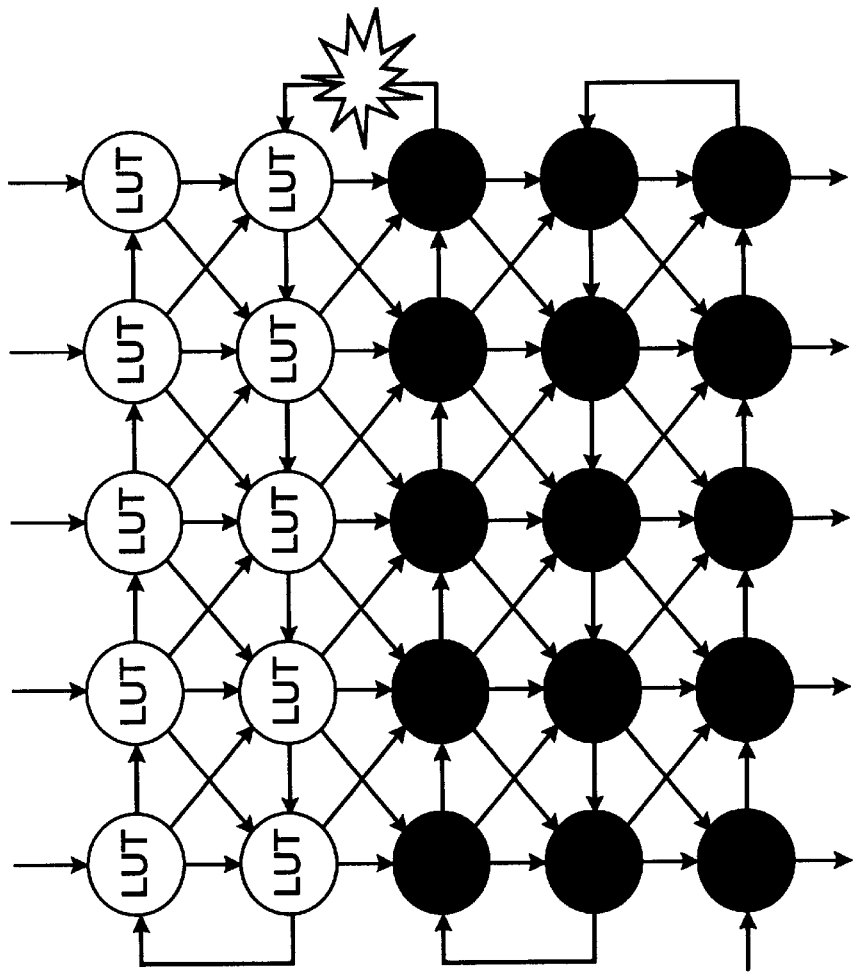
FIG. 23 shows the impact of a single defect in the FIG. 22 configuration scheme.

The connection of the configuration facility of the proposed architecture is often suppressed in figures for clarity. In FIG. 22, it is shown explicitly in a very simple form. This form may not be the best, however. As shown in FIG. 23, if a single defect occurs on the configuration "path" that meanders through all the LUTs, then the entire tile is render useless. In FIG. 23, the shaded LUTs do not ever get personalized due to the defect. Hence, the entire tile is "dead". This is easy to see because: (1) all LUTs "downstream" from the defect will never be personalized and (2) no signals can propagate through the unpatternable LUTs.

Figure 24:
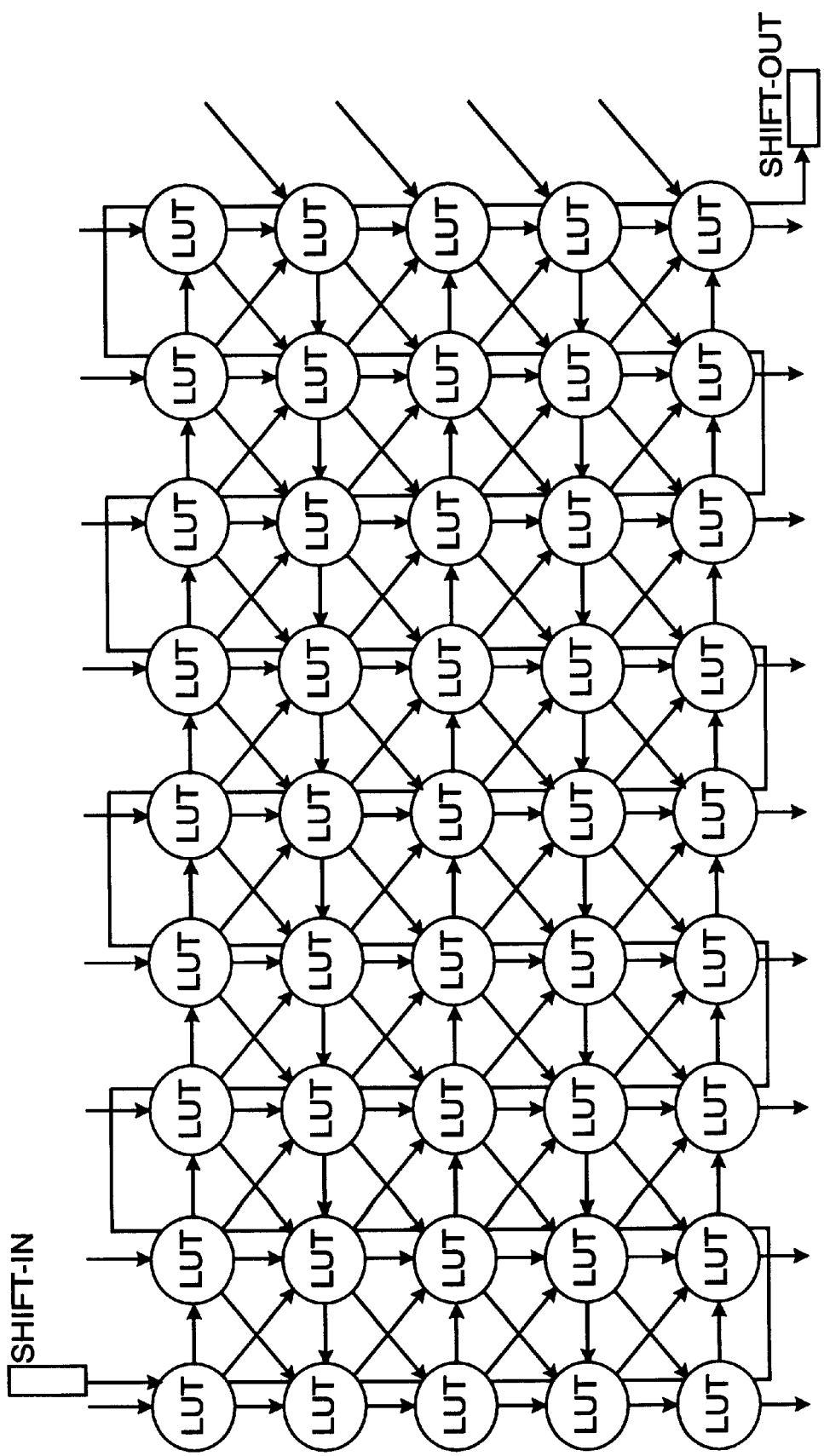
FIG. 24 demonstrates a variation of shift configuration for improved robustness.
Figure 25:
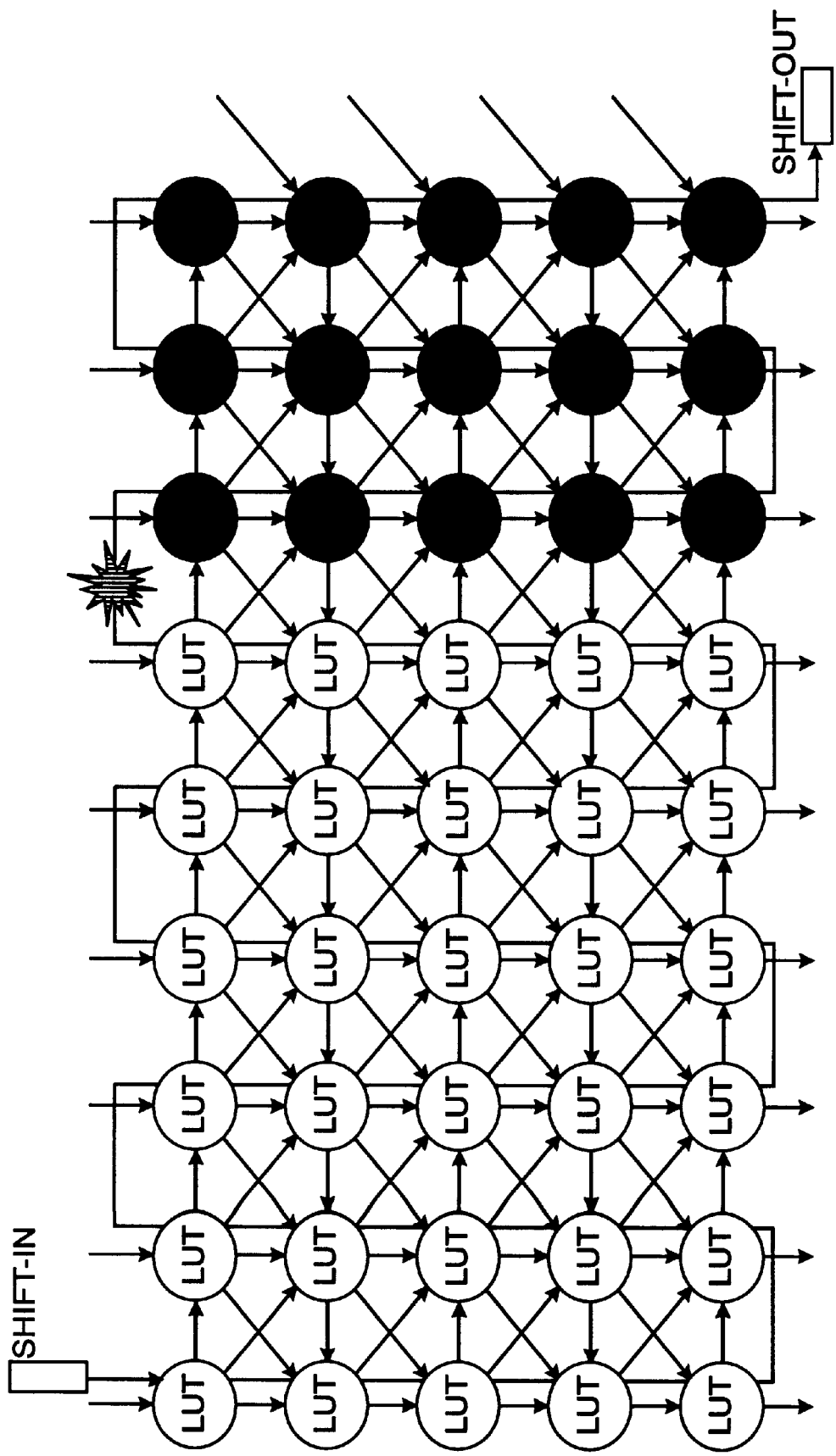
FIG. 25 demonstrates a variation of shift configuration for improved robustness when a defect is present.
Figure 26:
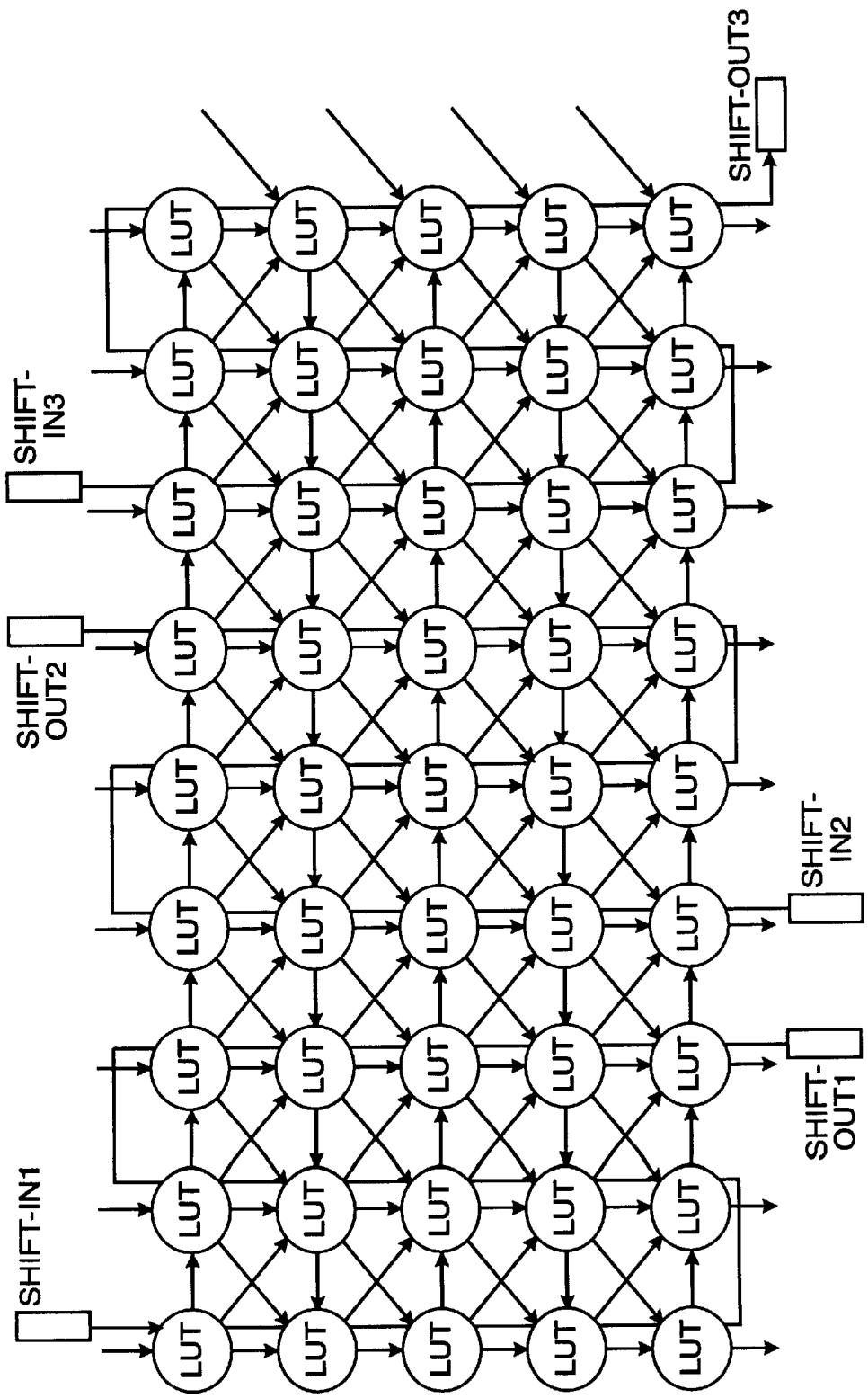
FIG. 26 shows the use of multiple bitstreams to contain point failures.

Two simple improvements greatly improve the robustness of the tile configuration system. The first is to link between LUTs in the direction or axis of propagation, as shown in FIG. 24. If a defect occurs, as shown in FIG. 25, then at least part of the tile can be functionally recovered. Another improvement to the configuration scheme involves the use of multiple bitstreams, as suggested in FIG. 26 to provide containment zones for failures.

A number of potentially substantial advantages of such an architecture are indicated. It possesses easily iterated structural features (LUTs with a fixed nearest neighbor connection grid) that can be mass created and extended to very large architectures. Even if Pentium computer chips could be built on a nano-scale, the placement and routing of large numbers of special cells in a fixed arrangement may have the consequences of intractability on various scales, including fabrication and computer-aided-design.

Testability is in principle very simple. It will probably be possible to achieve 100% fault coverage by using the homogeneous network itself to perform testing. Special diagnostic programs can be developed to exercise every wire and node of a complex network, with very little guesswork. Contrast this case with nano-scale, full-custom logic, where even with fault-grading and coverage at 99.99%, an unacceptably high number of failures could go undetected.

The architecture could be very forgiving of faults. Similar to hard disk drives, bad locations could be identified and fed to the logic decomposition and technology mapping software. Algorithms and heuristics for mapping around defective cells in FPGAs could be readily adapted, creating a system that could in most cases implement any conceivable function despite a number of failed regions.

Timing within a block of homogeneously interconnected LUTs is absolutely deterministic since every input signal must pass through the same number of LUTs in order to reach an output. Even when side coupling is exploited, the number of LUTs involved in a particular computation is known and timing can be established. This feature is useful in timing analysis of very complex designs.

Figure 27:
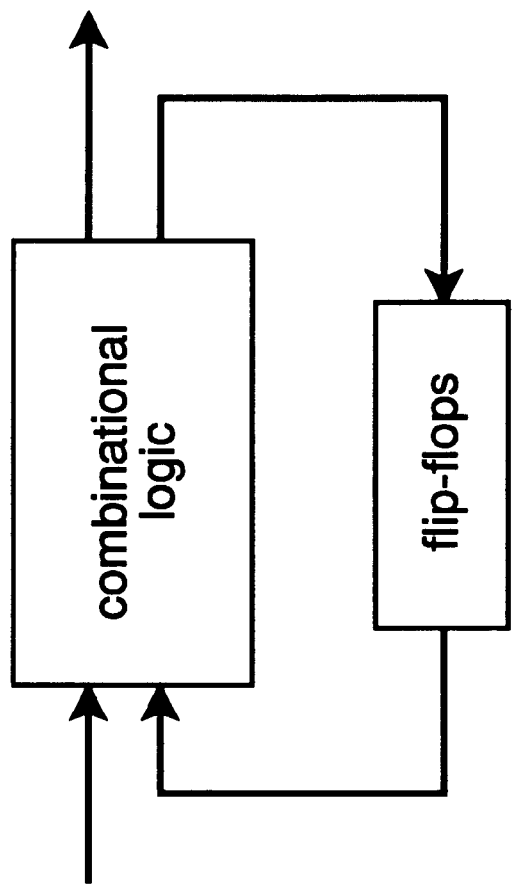
FIG. 27 shows two logic array blocks containing m×n LUTs interfaced through a 1-D array of molecular flop-flops.
Figure 27:
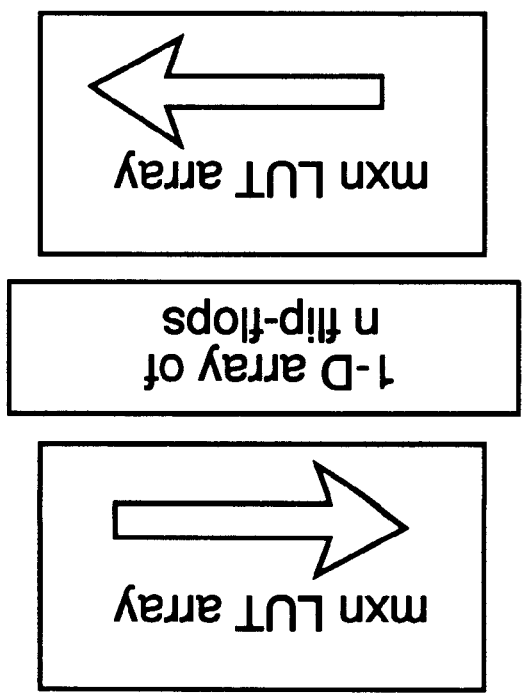

Extending the general computation fabric involves combining blocks of LUTs with "user" storage and providing input/output terminals. While each LUT is comprised of memory cells (as previously discussed) to store the behavioral pattern corresponding to a Boolean finction, this memory cannot be modified as a by-product of operating the FPGA (only through reconfiguration, which affects many LUTS at once). Hence, registers must minimally be added in the case of 1-D MFPGA, and these registers can be clocked externally (An approach to achieve asynchronous sequential behavior can be directly achieved in 2-D and 3-D CAs through local feedback, as will be discussed later). One example of such an arrangement is shown in FIG. 27. In this case, two logic array blocks containing m×n LUTs are interfaced through a 1-D array of molecular flip-flops. This arrangement corresponds to the general representation of a combination-sequential digital system (shown to the right of FIG. 27). The flip-flop array exploits side coupling to provide state preservation, as needed to synthesize finite state machines. In this model all 1-D flip-flops are synchronized with a common clock and are limited in frequency only by the total delay represented by 2m flip-flops.

Figure 28:
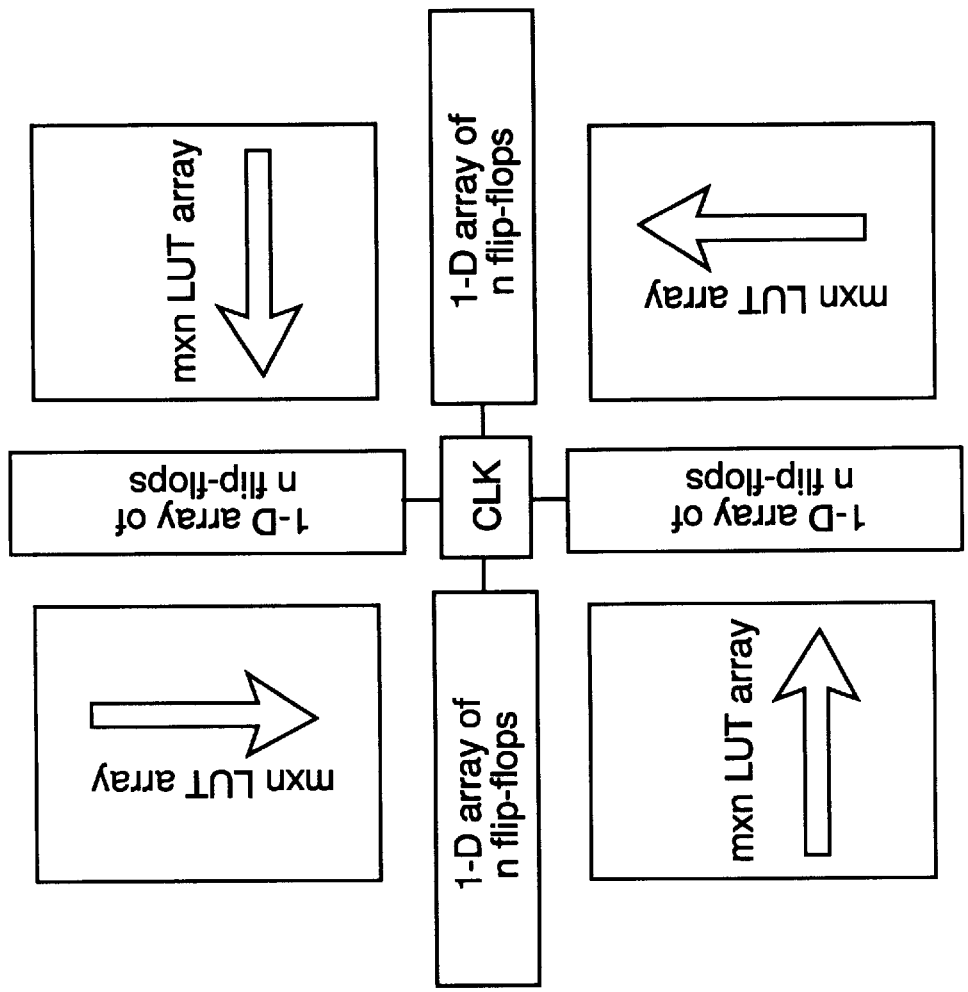
FIG. 28 shows sample arrangements of LUTs and flip-flops.

Many other arrangements of LUT tiles and flip-flops are possible. FIG. 28 only begins to hint at the possibilities. Any juxtaposition of tiles either forms a larger tile (when the tile directions are the same) or creates a FPGA with path feedback capability (when the directions are opposite in the case of two tiles, or complete a 360 degree "loop" in the case of more than two tiles). If registers are interposed between tiles, then the feedback behavior is synchronous (compatible with automated digital behavior synthesis design tools); otherwise, asynchronous behavior will result. The fact that omitting registers leads to asynchronous behavior is a simple result, since registers permit "registering" event from input to output to coincide with a clock signal. Removing the registers permits the formation of feedback loops, which sometimes are manifested in subtle and complicated ways in the circuit. As such, asynchronous digital design is a more involved discipline, much less common in practice but certainly possible.

So, by allowing multiple tiles to be connected together so that they form within the composite structure (considering all tiles) propagational paths that can feedback within the composite structure, with or without a linear register interposed between the tiles (whereby the former case gives rise to synchronous logic behavior and the latter case giving rise to the more general form of asynchronous logic, which admits the possibilities of race conditions), a general approach to realizing complex digital systems is established. As a minimum, a molecular FPGA architecture is comprised of a single tile of LUTs (m rows and n columns). Even if the outputs of such a minimal FPGA are "registered", the construction is of limited utility, since the rich behavioral complexity of modem digital systems requires the ability to achieve feedback behavior. Therefore, more useful molecular FPGAs are formed by arranging a number of tiles in patterns that can, as previously suggested, give rise to sequential feedback behavior.

Figure 29:
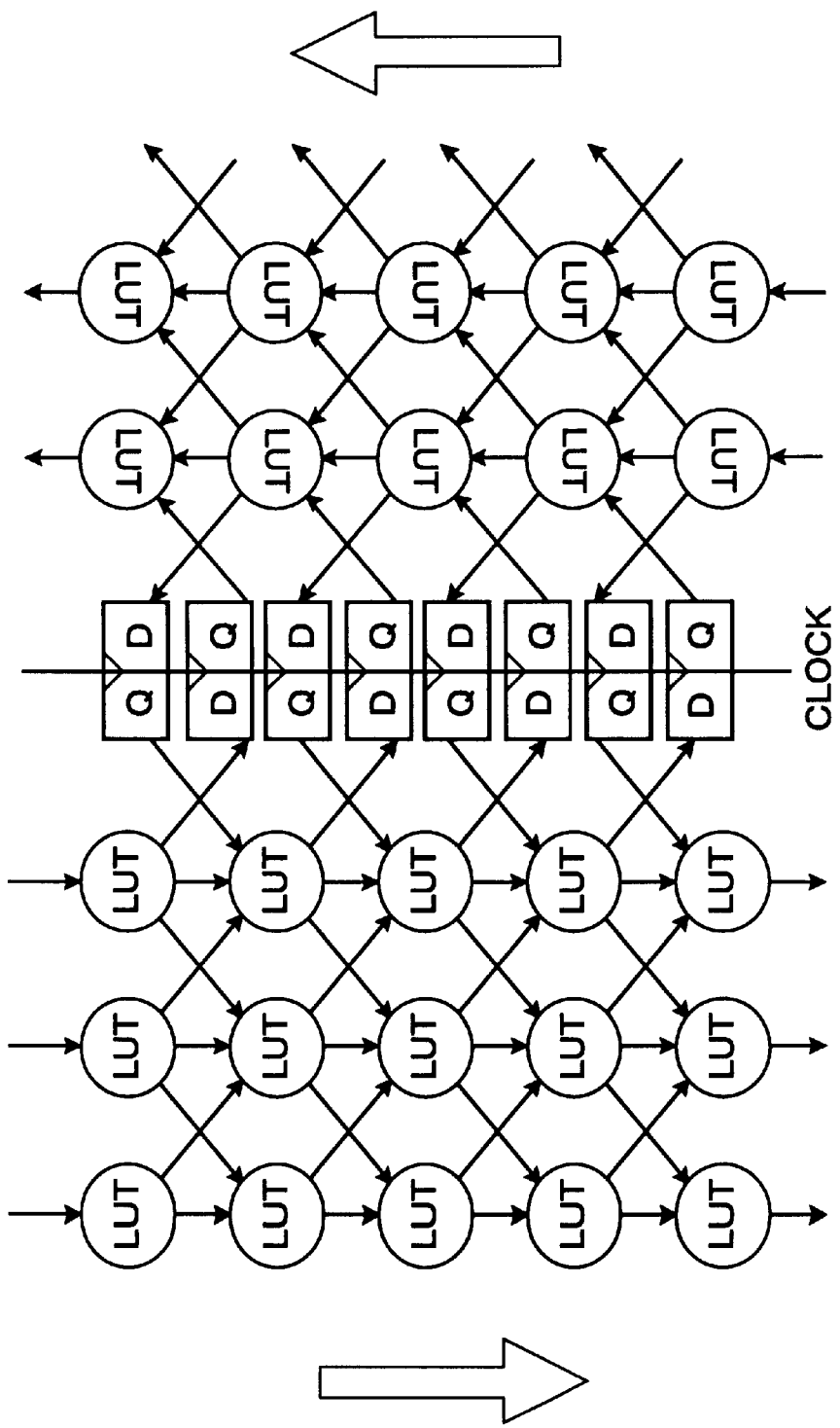
FIG. 29 details how a register array can be used to interface two tiles.

Details of how a linear register arrangement specifically interfaces between two articulating tiles are shown in FIG. 29. Here, the register "directions" are alternated, permitting signals to be latched and interchanged between tiles. Most significantly, whenever tiles are articulated (brought together), they: (1) may or may not employ a register file (which provides for synchronous state or data storage), and (2) each tile usually has a different propagation direction. As shown in FIG. 27, the two tiles propagate in completely opposite directions. As shown in FIG. 28, the four tiles propagate at 90 degree angles.

In order to obtain feedback behavior, it is necessary to be able to route signals back within the structure. When registers interpose tiles, synchronous feedback is possible. When tiles directly interface without registers, asynchronous feedback is possible. In the latter case, great care must be exercised to avoid race conditions (hazards), but it is possible to exploit additional system possibilities in this manner.

Figure 30:
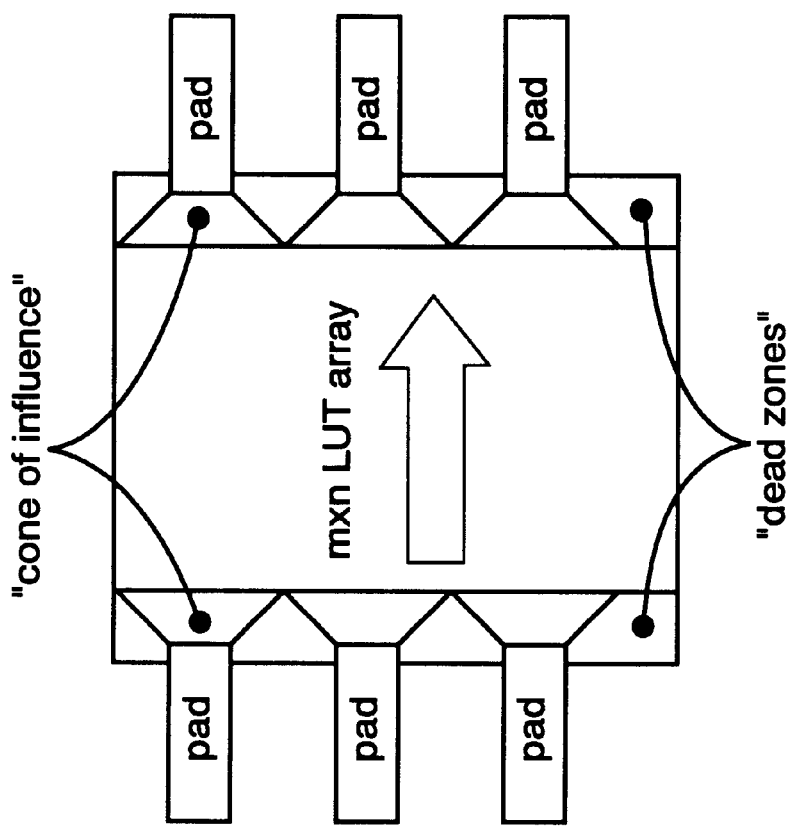
FIG. 30 shows how input/output terminals to the system might be interfaced to the LUT blocks.

Input/output (I/O) terminals to the system can be interfaced to the LUT blocks (see FIG. 30). In nano-scale implementations, the sheer density of LUT columns precludes attaching a wire at every LUT. As such, pads would be attached at a pitch dimension p, selected according to the packaging technology used for the overall system (e.g., 70 $\mu$m for wire bonds, etc.). The inability to place contacts at every LUT column creates a "dead zone" situation, in which the inputs or outputs on particular LUTs are inaccessible. This is due to the fact that in the proposed architecture, each LUT can only connect to the first three nearest neighbors of the preceding row. As such, a "cone of influence" defmes the range of interactions possible with LUT arrays from particular points. Algorithmically, these effects are of little consequence to technology mapping software, and it may be easier in the molecular assembly process to simply build those regions in and ignore them in the ensuing implementation of the reconfigurable processing system.

These properties of the MFPGA can result in a situation where the attachment of I/O is furthermore probabilistic in two ways. First, if the I/O attachment misses a desired connection location, and instead the attachment connects to a different source LUT, then through a diagnostic procedure, it will be easily possible to deduce the exact point where the terminal attachment occurs. Briefly, the procedure consists of a sequence of programs fed into the MFPGA which provides for the "geo-location" of termini, so long as the termini can be exercised with patterns. The second facet of robustness for terminal attachment is that it is not necessarily important for I/O to contact a single LUT input. For the very same reasons that the architecture is defect tolerant and easily testable (by feeding into the MFPGA various diagnostic configurations), the MFPGA can, by design, be somewhat indifferent to the exact location of terminals. This feature allows precision in terminal attachment/assembly to be relaxed.

Figure 31:
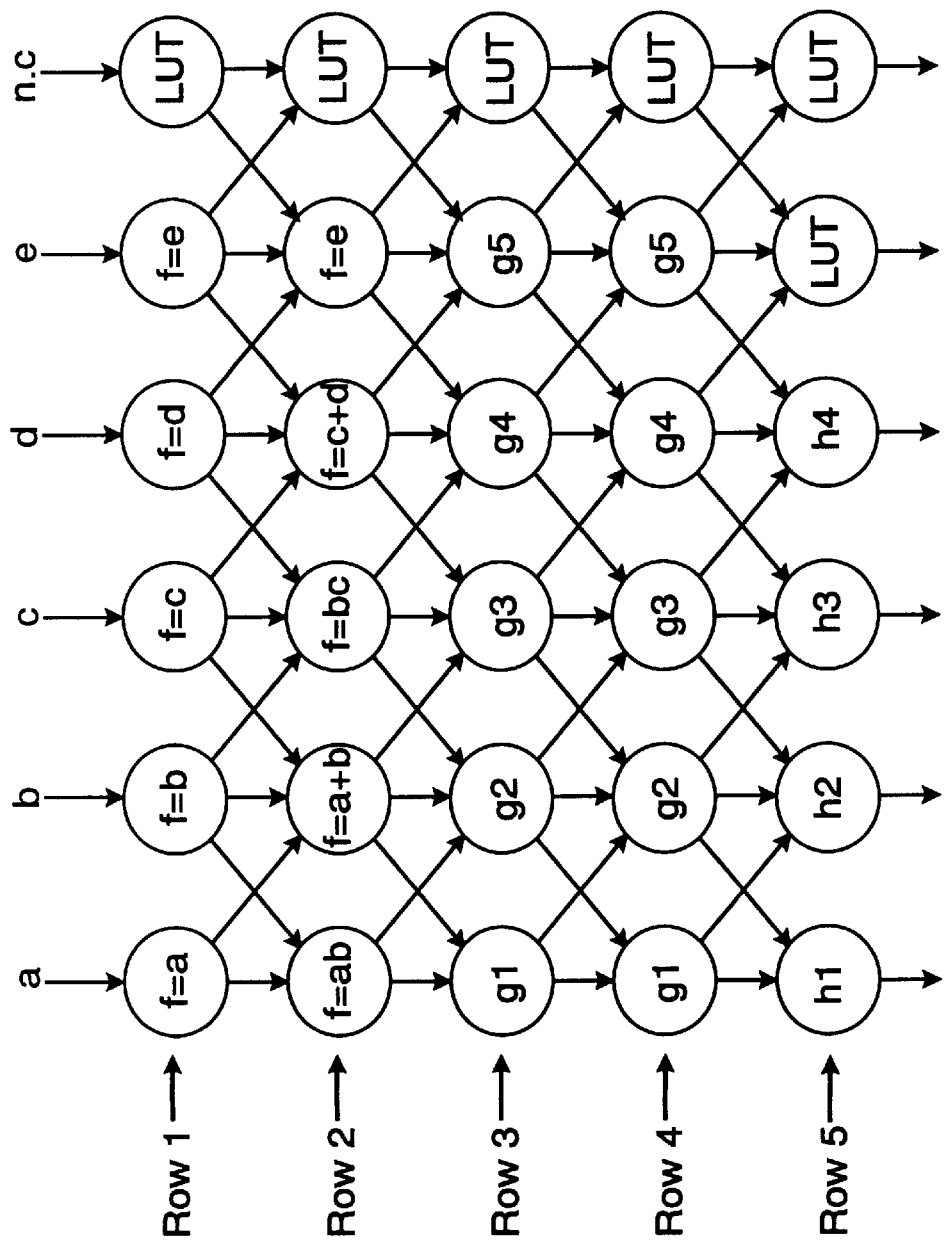
FIG. 31 is an example of a defect-free logic section.

The fault tolerance of the proposed molecular field programmable gate array architecture is easily shown to be a by-product of its regular structure when combined with appropriate design methodologies and Boolean synthesis heuristics. In the simple defect-free logic section example in FIG. 31, a set of five input variables (a, b, c, d, and e) are used to generate four functions (h 1, h2, h3, and h4). Given the likelihood of many single-point fabrication defects, it is important that architectures for nano-scale electronics be robust enough to deal with random defects.

Figure 32:
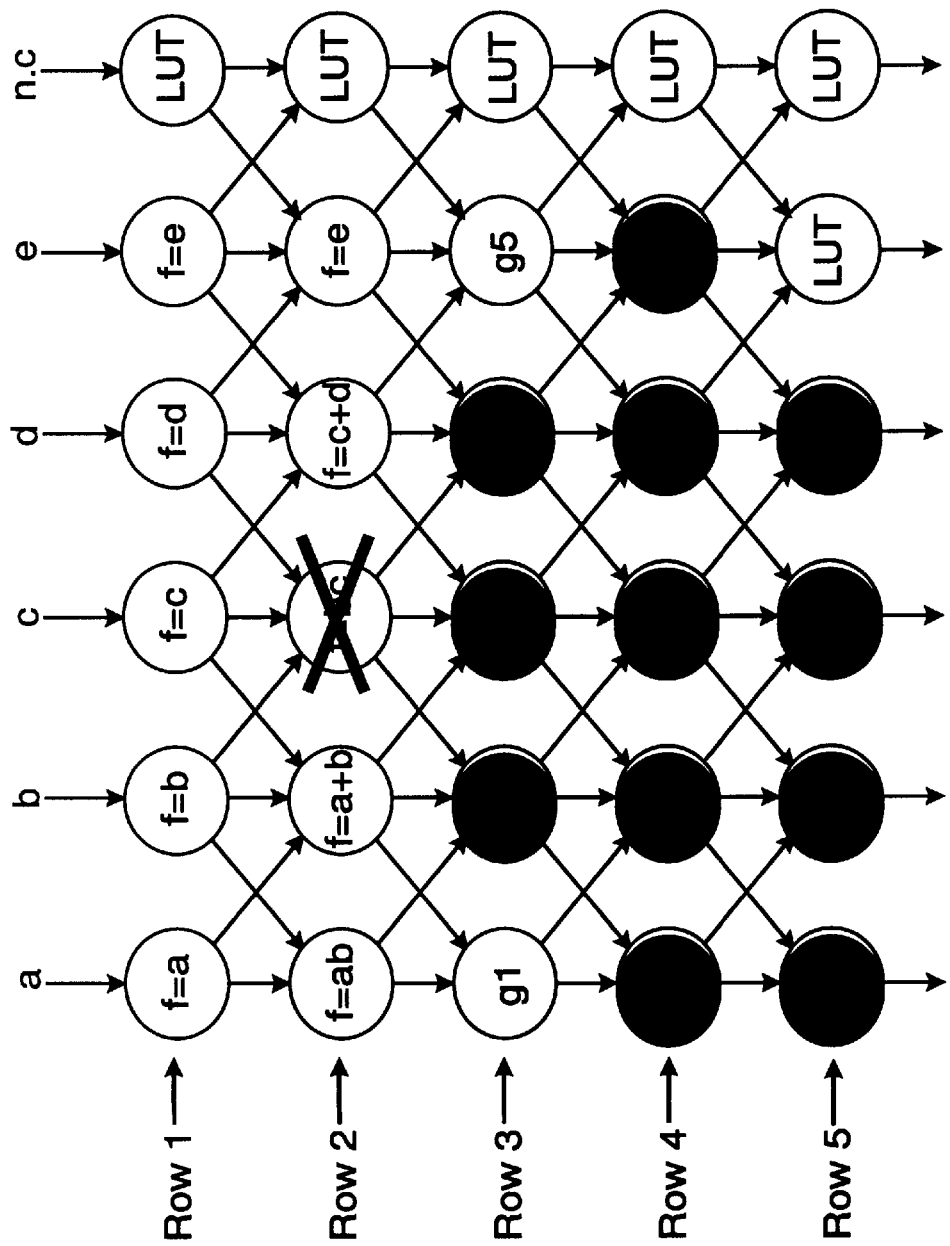
FIG. 32 is a sample logic section with a single random defect.

The example logic functions shown perform a variety of Boolean operations on variables (a–e) and generate intermediate results and eventually generate final functions (h1–h4). To illustrate a potentially likely random defect, FIG. 32 shows the impact of a defective LUT in the second row. Based on the cone of influence, most if not all functions dependent on the defective cell are also defective, The consequences to a non-reconfigurable design would be potentially disastrous.

Figure 33:
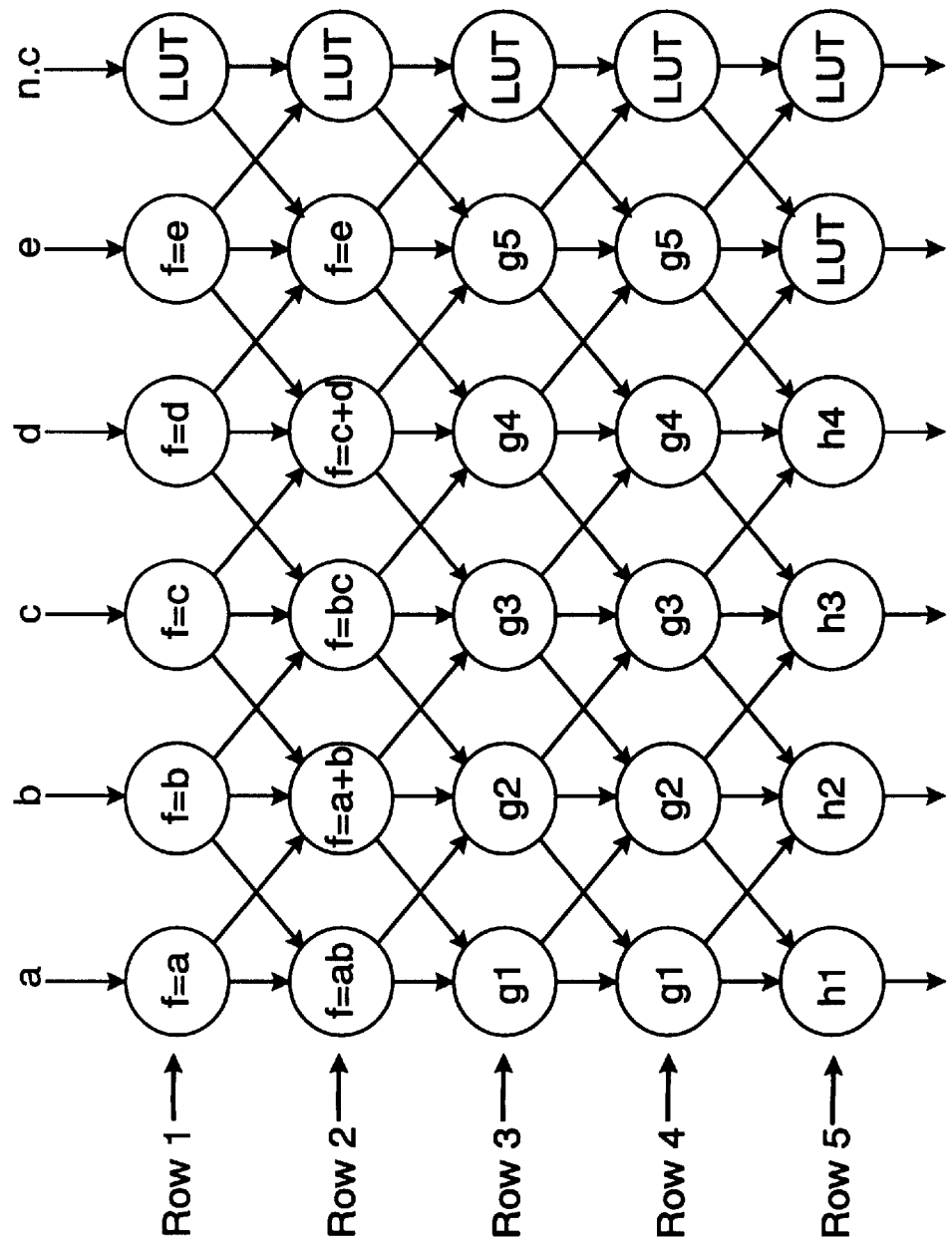
FIG. 33 shows how re-mapping can bypass the defect.

Fortunately, the ability to reconfigure a vast sea of logic/ routing resources makes it possible to readily recover from such defects. An example re-mapping is shown in FIG. 33. In this case, the single defect is circumlocuted and any ill effects can be safely ignored.

The key to surviving fault tolerant conditions in such molecular FPGA would be based on several critical requirements: a large pool of reconfigurable (re-definable) resources; an arrangement of these resources to permit sufficient generality (multiple mappings of same functions); a process to formally identify defects (functional verification); and a set robust Boolean synthesis heuristics to accommodate defects.

The first requirement is met by the present architecture, which is presently the densest proposed reconfigurable system fabric. The second requirement refers to design methodologies based on the proposed universal computation. It will be necessary to provide "wiggle room" in the design space spanned by the present architecture to permit transparent re-mapping of functions, similar to that shown in FIG. 33. Such constraints are met through design disciplines exercised in the course of utilizing the proposed device. It is envisioned as previously described that an entire reconfigurable "chip" would contain many functional sub-domains containing vast tilings of the proposed LUT block structure. Synthesis (in the Boolean sense) would be a hierarchical procedure whereby any subset of the overall system would be partitioned into a given LUT block structure. If the partition is too tightly constrained (resources are too nearly fully prescribed), then a number of point defects would "break" the synthesis at that level, forcing a larger scale backtracking (re-allocation of functional subsets to LUT blocks). In this sense, the lack of "wiggle room" results in a more protracted synthesis, whereby even higher level allocations would need to be re-visited. Part of the architectural research to be carried out in this program will be to establish such "wiggle room" requirements and the effects of functional congestion on synthesis performance.

The third requirement for fault tolerance is the ability to identify defects. Fortunately, the same regular structure lends itself very well to formal verification of device, block, and subsystem functionality through the development of test programmations. As previously suggested, such a capability can be used to establish 100% functional verification. The technique for establishing functional verification is summarized as follows: an LUT program set of "personalities" is established that convert the behavior of all reachable LUTs into the equivalent of wiring patterns that verify the ability to reach all LUTs in different connection patterns. Several easy techniques are suggested here, and many other possibilities exist. Since LUTs can emulate wire as a specific instance of a Boolean formula, it is possible to verify a wiring pattern that can be evolved or "swept" throughout the device in a way that would uncover defects in transmission due to an malfunctioning LUT. In other words, a broken "virtual wire" is equivalent to the existence of one or more malfunctioning LUTs. Another approach to establish functional verification is to use the LUT array to simulate known behavior patterns of 1-D binary CAs. This method is simple in that the develop of test patterns can be done quickly and any deviation from expected outputs is easily detected. Achieving 100% coverage is based on selecting a minimal set of such patterns that uncover all "stuck-at" and transmission faults. Other forms of testing for pattern stability and pattern sensitivity can be developed from the same principles. Since the FPGA fabric is in principle infinitely reprogrammable, an entire battery of tests could be developed an applied as required to the arrays to establish fimctional verification.

Finally, the Boolean synthesis system must be "geared" to handle (circumlocute) a finite number of defective LUTs and/or LUT blocks. The realization of complex digital functions from specifications, the common mode of development for complex ASICs, requires the nested solution of many non-deterministic polynomial time (NP-complete) problems in order to arrive at viable solutions in a given medium, whether fixed silicon gate arrays or reconfigurable gate arrays. The process of realization, referred to as Boolean synthesis, generally assumes fully functional resources in the medium, which is probably not a realistic assumption for molecular scale devices. It is necessary, therefore, to consider robust synthesis procedures, whereby a number of known defects, particular to individual devices (identified by a pre-test process), are provided as inputs to the specification procedure, just as the specifications themselves are provided. This situation is analogous to the bad block tables associated with hard disk drives in earlier days of personal computing. Given the bad block map, a hard drive could be formatted in such a way as to ignore defects. We indicate here that a similar approach (in principle) can be applied to achieve maximum yield in molecular devices. It is in fact these fault-tolerant characteristics that may make this very type of architecture the most tractable proposed for nanoscale/molecular scale computational electronics.

Figure 34:
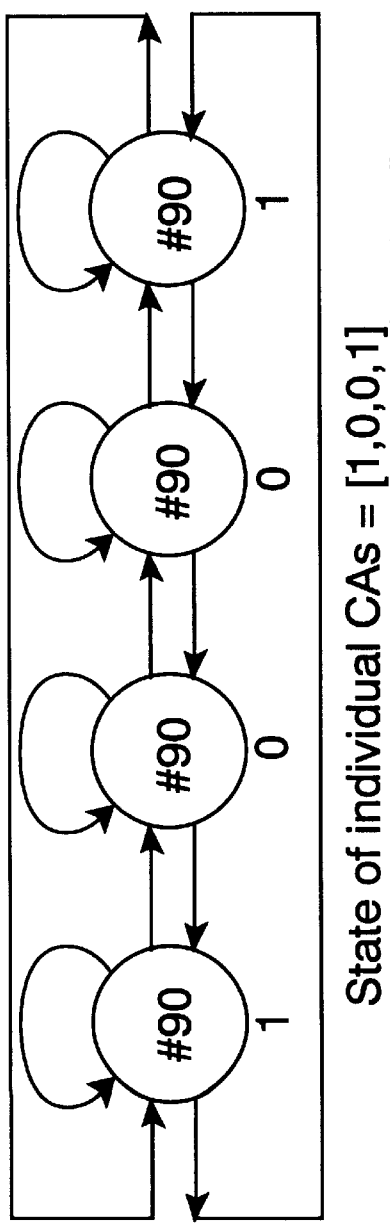
FIG. 34 comprising of FIGS. (a), (b), (c), (d) and (e) is a simple example of a four-cell 1-D CA (with the neighborhood of 3), describing a state transition graph for both the periodic and null boundary cases when the rule #90 is applied.
Figure 34:
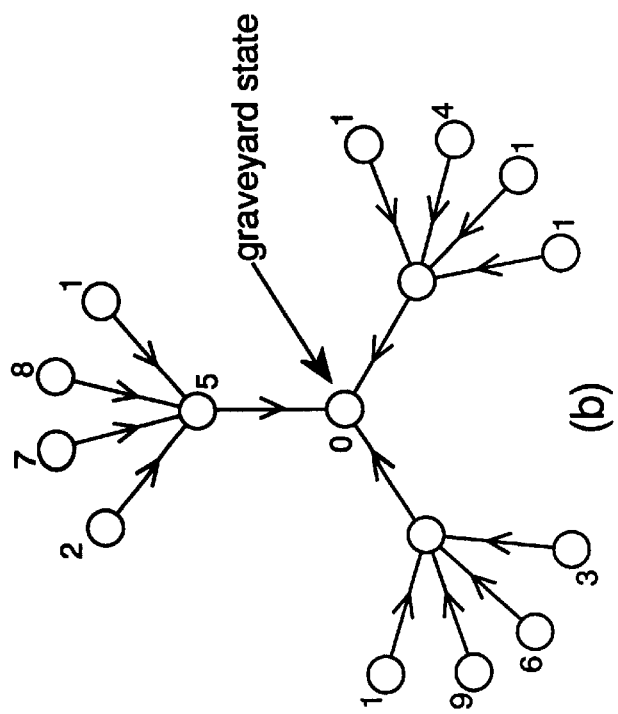
Figure 34:
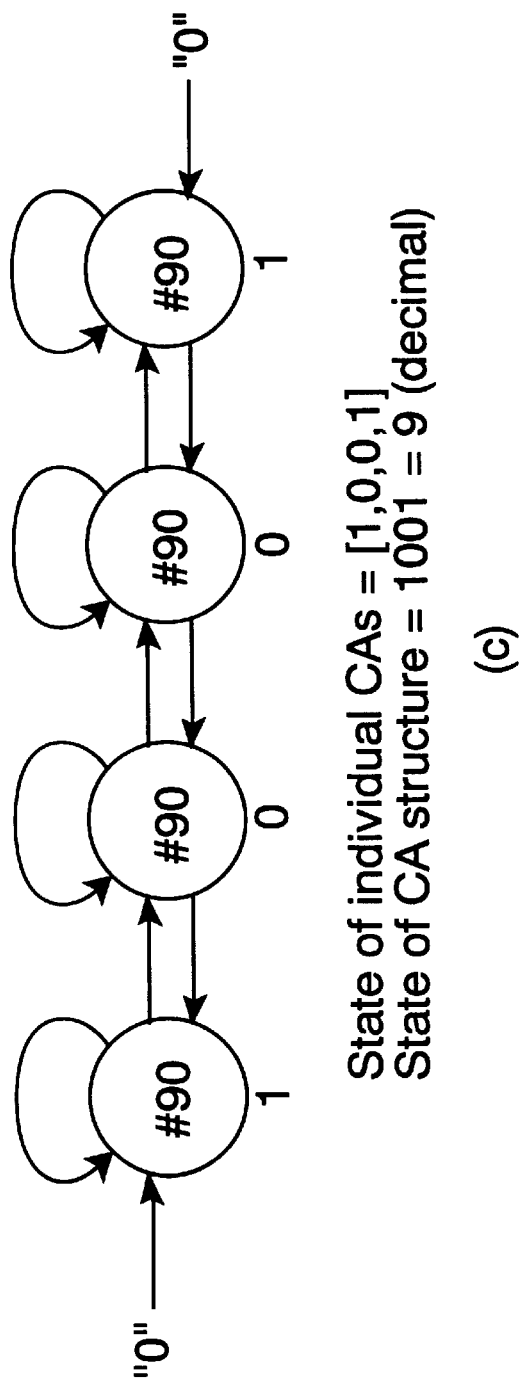
Figure 34:
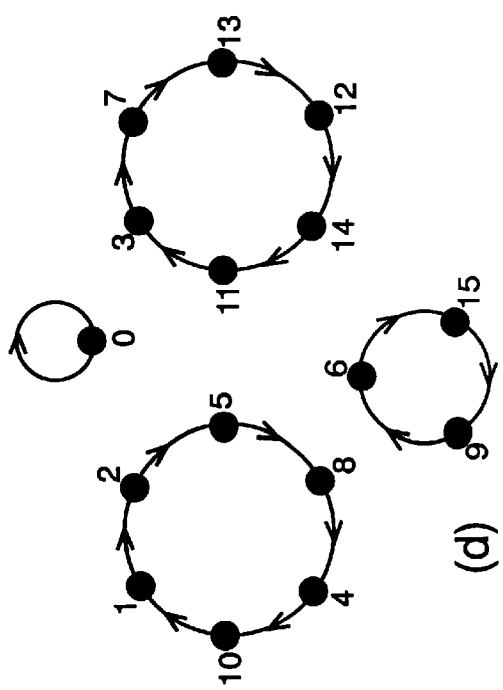

By virtue of its analogy to CA structures, the present invention can leverage the extensive research base that has emerged to understand and exploit CA behavior. Because simple CA structures can be thoroughly analyzed and yet can display very rich and complex behavior, they have fascinated researchers since their inception (the concept of CA was originally introduced by von Neumann [Das, A. K. et al. "Efficient Characterization of Cellular Automata", *IEE Proceedings-E*, vol. 137(1), January 1990.]). For the case of the present invention, the preceding CA research is expected to have benefits to the analysis, characterization, test, and design of circuitry to exploit the CA fabric. For example, in Pries et al, the group properties of CA are examined, in particular the cyclic behavior manifestations when particular CA rules are invoked or when particular arrangements of CAs with null or periodic boundary conditions are invoked. In a simple example of a four-cell 1-D CA (with the neighborhood of 3), Pries et al. described a state transition graph for both the periodic and null boundary cases, when the rule #90 is applied. For this CA, shown in FIG. 34(a) state is encoded as a binary numeral. The case shown in FIG. 34(a) is a periodic-terminated CA, whose state (reading left to right) is "1001"=9. Based on which of the 16 possible states ("0000" through "1111") this CA is in, the next state of the CA will take on particular values, as shown in the state transition graph in FIG. 34(b). In this particular case (FIG. 34(a)), the CA will display a behavior that progressively evolves to a state of "0000" or decimal 0. It is shown that even for the same CA structure with the same initial state ("1001"), that by changing the CA structure termination conditions, a completely different behavior will result. For example in FIG. 34(c), the CA structure is almost exactly the same as the one in FIG. 34(a), except that the CA is null-terminated instead of periodic-terminated. As a result, a cycle-of-three or modulo 3 periodic behavior results. Clearly this CA, if in a different initial state, would display a modulo 6 behavior (in two different ways) or a continuously repeating behavior.

Figure 34E:
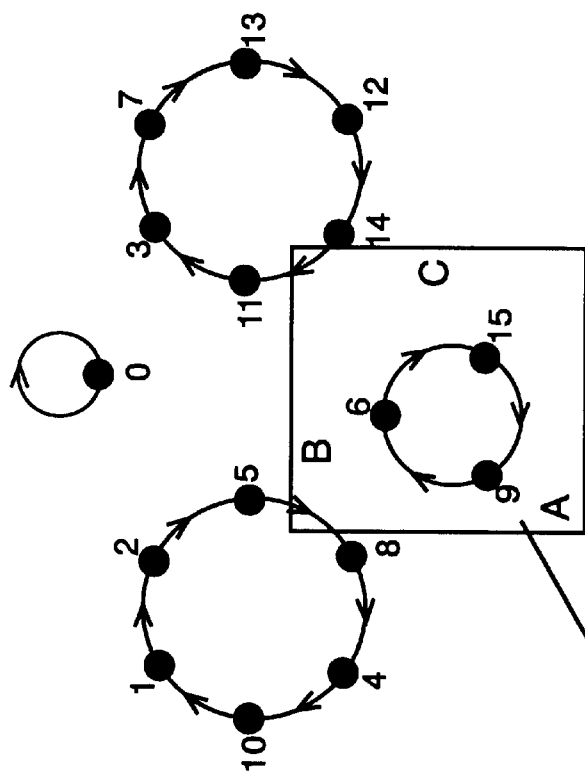
Figure 34E:
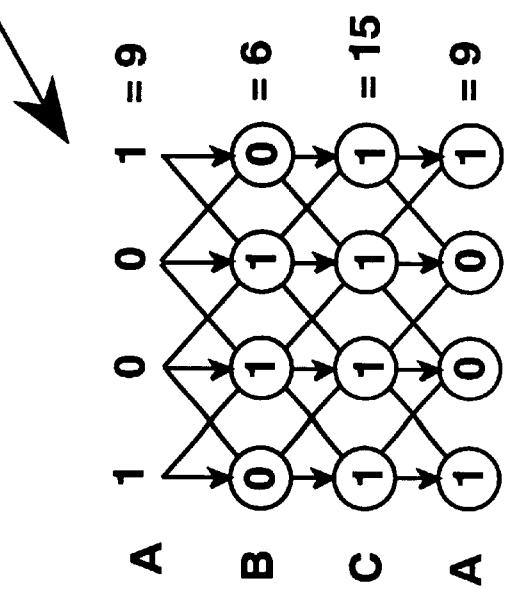

The same behavior for the 1-D CA with four cells and rule #90 is shown in the equivalent MFPGA structure in FIG. 34(e). Here, the temporal-to-spatial conversion is clearly depicted. Whereas in the 1-D CA case, the state evolves over time inside the same cells, in the MFPGA, it is shown that the behavior evolves progressively through the 2-D structure. In other words, the first row of the MFPGA is equivalent to the 1-D CA at time instant 0, the second row is equivalent to the CA at time instant 1, etc. Eventually, the pattern of "1's" and "0's" repeat, due to the fact that the corresponding CA and initial conditions corresponds to this type of behavior (modulo 3).

Even in this narrowly defined instance, CA behavior can be usefully exploited. In test, for example, these state transition graphs swerve as a signature of expected behavior, and it is conceivable that a rich variety of test patterns could be developed from these types of cyclic behavior. For circuit design, these transition graphs are clearly convenient for designing modulo counters and complex pattern generators. Clearly, the possibility of performing modulo arithmetic with CAs was identified by Pries et al., and exploiting this feature in the MFPGA could lead to convenient simplifications in some aspects of algorithms designed to decompose/ map circuits into the MFPGA. (Pries et al, "Group Properties of Cellular Automata and Applications", IEEE Transactions on Computers, Vol. C-35(12), December 1988).

In 1-D CAs, Wolfram identified the ability to directly emulate linear feedback shift registers (LFSRs), which have many possible roles in design. One such application for LFSRs, identified by C. L. Chen, in is test pattern generation (C. L. Chen, "Linear Dependencies in Linear Feedback Shift Registers", *IEEE Transactions On Computers*, C-35(12), December 1986). Also, the use of CAs explicitly for pseudo-random number generators was identified by Tsalides et al (Tsalides et al, Pseudorandom Number Generators for VLSI Systems based on Linear Cellular Automata, *IEE Proceedings-E*, vol. 138(4), July 1991). In both of these applications of CA to VLSI design, the CAs were not spatially unraveled, as is the case of the present invention, nor is a look up table approach used. Rather than use LUTs, logic corresponding to the specific CA rule is hard-wired in these applications. Obviously, the present invention can exploit these applications as a degenerate subset of their potential capabilities. Das et al also made the connection between CAs and LFSRs and their use for constructing self-test structures (Das et.al., "Built-in Self-Test Structures around Cellular Automata and Counters", *IEE Proceedings-E*, vol 137 (4), July 1990). Chang et al. evaluated the use of so-called maximum length cellular automata for stream ciphers and claim that CAs can in a VLSI implementation be realized more efficiently than equivalent LFSR-based implementations. In this case, each CA rule may be distinct. (Chang et al., "Maximum Length Cellular Automaton Sequences and Its Application", Signal Processing 56 (1997).).

These findings suggest the potential of a dual benefit for the present invention. The first benefit is the ability to use a CA-inspired approach as a general digital implementation fabric. The second benefit is that in those cases where the nature of CA behavior is advantageous, the present invention is uniquely able to exploit that relationship. This suggests the possible improvement in automated design software to recognize those parts of a complex design amenable to a FPGA-based view and those parts amenable to a CA-based view.

Other research findings have pointed to the possibility of using a CA basis for FPGA architecture. Chatopadhyay et al. suggests the use of a specific cell design inspired by two specific CA rules (#90 and #150). Though this research effort identified the potential of a time-to-space transformation, similar to that suggested for the present invention, it only unfolds one stage. Thus, remarkably, the research did not identify the benefits of universal CA realization and a more extensive depth of spatial unraveling. Chatopadhyay et al. also proposes a more complex fundamental cell (5-input, 3-output) than that in the present invention. Most significantly, this effort did not employ LUTs at all, but rely on decomposition heuristics to map a given Boolean (digital) problem into logic based on a non-simple cell comprised of a hybridization of elemental CAs based on rules #90 and #150. Even so, the research is intriguing in that it suggests that a CA-inspired FPGA may be competitive with traditional FPGAs developed by the industry, which of course are not CA-inspired (Chatopadhyay, S. e al. "Technology Mapping on a Multi-Output Logic Module Built Around Cellular Automata Array for a new FPGA Architecture", $8^{th}$ *International Conference on VLSI Design*, January 1995.)

Figure 35:
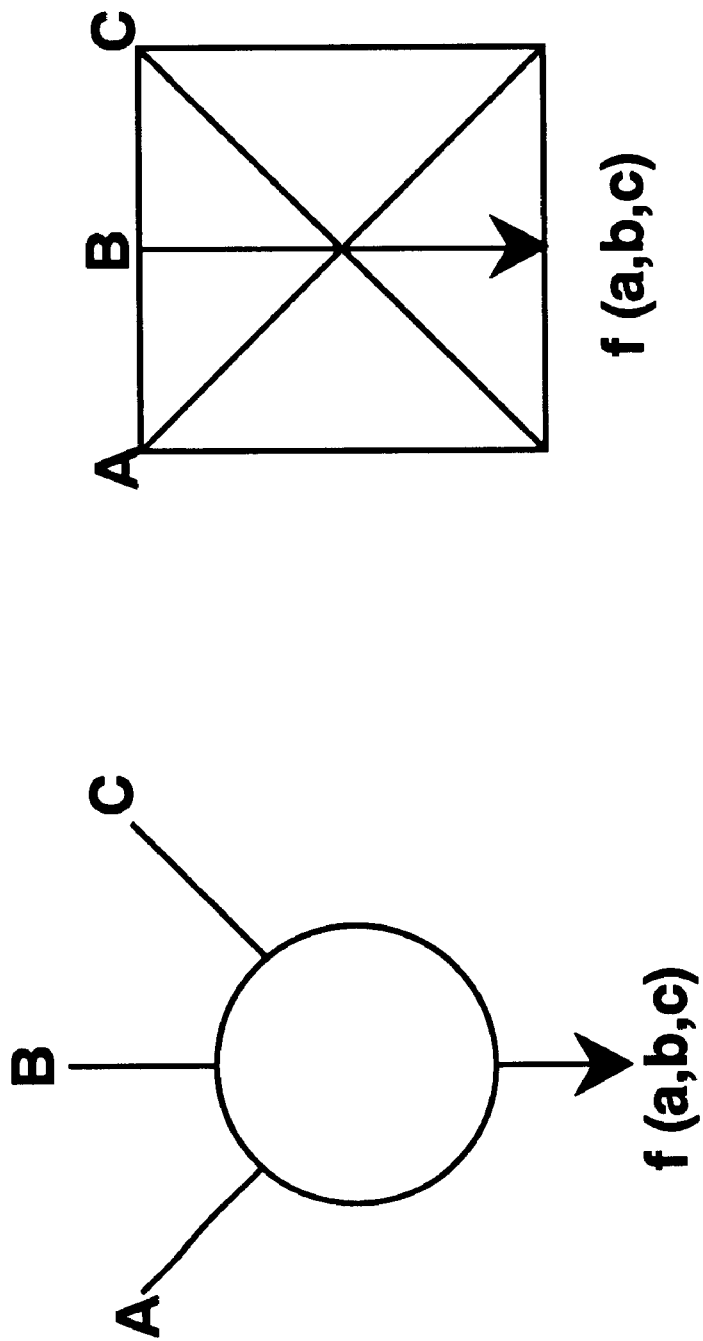
FIG. 35 is a symbolic representation of a 3-LUT.

We are now in a position, having defined a basis of a MFPGA around a very simple CA, to discuss more systematic extensions. The extensions include definitions of MFPGAs for two- and three-dimensional CA architectures. A convenient simplification of the 3-LUT representation is shown in FIG. 35. This may be called a "tesselation symbol". With the new representation, a 3-LUT tile is represented by any arrangement of tesselation symbols where: (1) at least one square edge is perfectly aligned to a square edge of a neighbor and (2) the direction of the arrows are the same. Since this juxtaposition is always possible, the term "tesselation" is appropriate descriptive of the symbol. Two examples are shown in FIG. 36.

Figure 36:
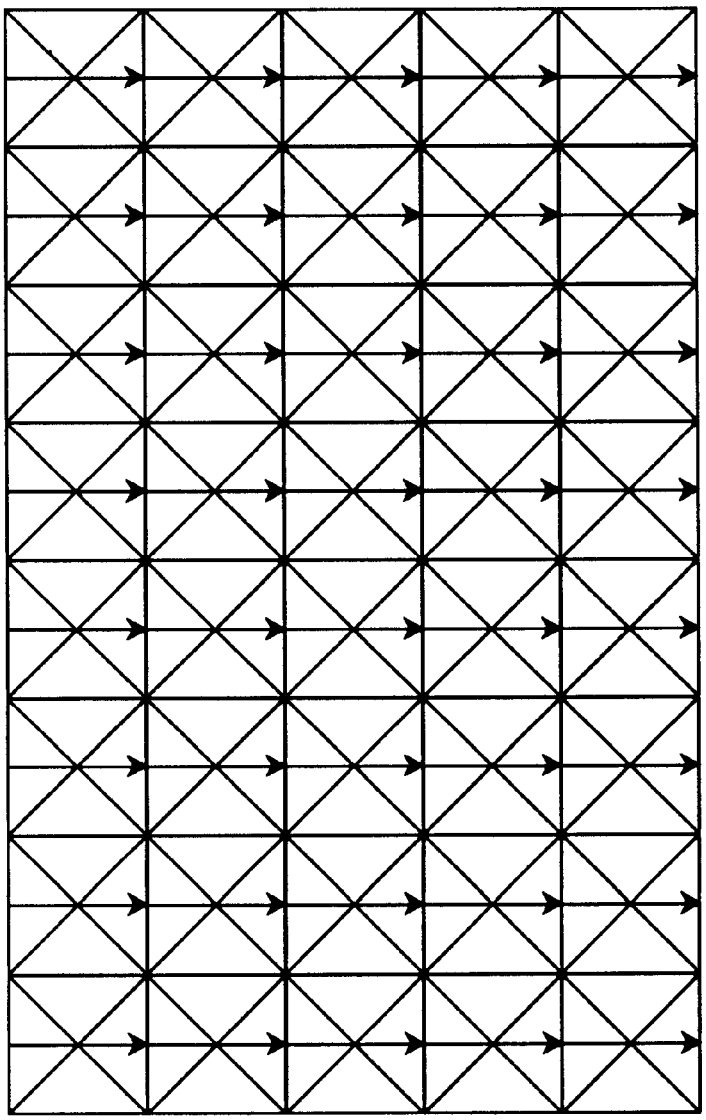
FIG. 36 comprising of FIGS. (a) and (b) is a 3-LUT tile represented by any arrangement of tesselation symbols.
Figure 36:
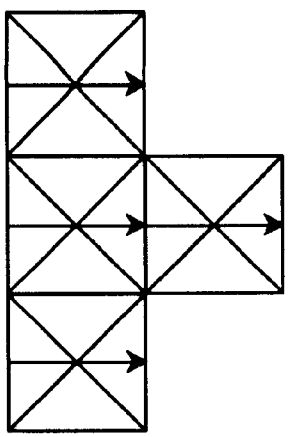

In FIG. 36(a), a very simple arrangement of four LUTs is shown. This arrangement is called a "dependency arrangement" because the forward-most 3-LUT has another LUT in each position bearing upon its functional dependence. In other words, the 3-LUT that is at the bottom of the figure can implement any function that depends on (and only on) the other 3-LUTs above it. In FIG. 36(*b*), an example of a very small tile containing 8×5 (40) 3-LUTs is shown. It is expected that in molecular implementations, much larger tiles (several thousand rows and columns) could conceivably be implemented.

Figure 37:
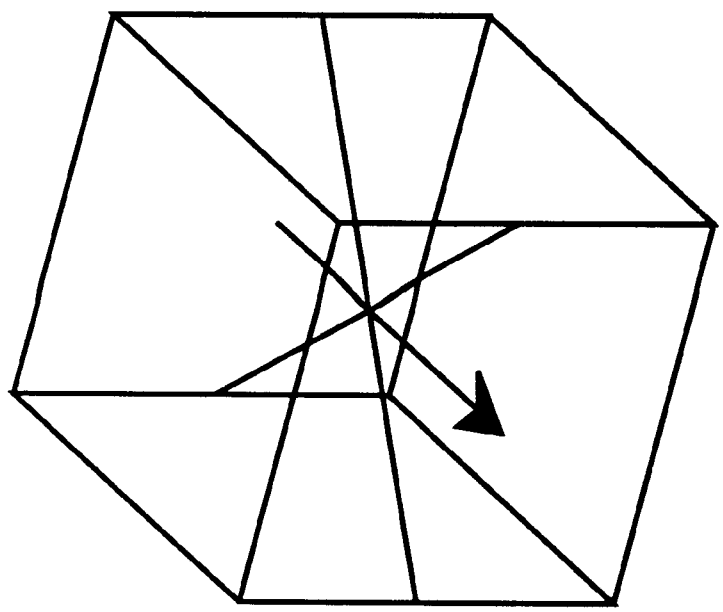
FIG. 37 is an isometric 3-D physical view of the 3-LUT tesselation symbol.

Next, we provide a slight variation of the 3-LUT tesselation symbol, in which an isometric 3-D physical view is provided (FIG. 37). Even though this isometric view of a 3-LUT tesselation symbol appears physically to be a 3-dimensional block, the FPGA is said to be one-dimensional, since the results propagate in one-direction only.

Figure 38:
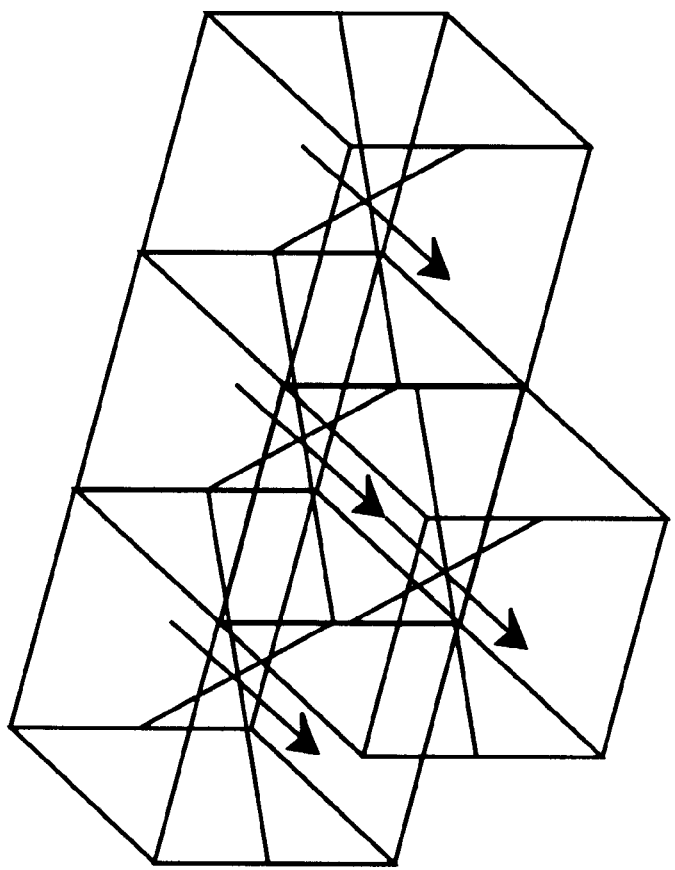
FIG. 38 shows the dependency arrangement for a 3-LUT using a 3-D version of the tesselation symbol.

We next show the dependency arrangement for a 3-LUT using this 3-D version of the tesselation symbol in FIG. 38.

This development motivates the consideration of other tesselation symbols, and the progression of symbolic representations will be shown now to lend itself to representing a more complex and powerful possibility. Not to be illustrated are simple extensions of the previously developed (FIG. 16) 1-D CA architectures to 5-input LUT or 7-input LUT templates, as these are fairly obvious. It should be remarked that such templates will be more complicated to actually implement, especially with respect to the side-coupling structures.

Figure 39:
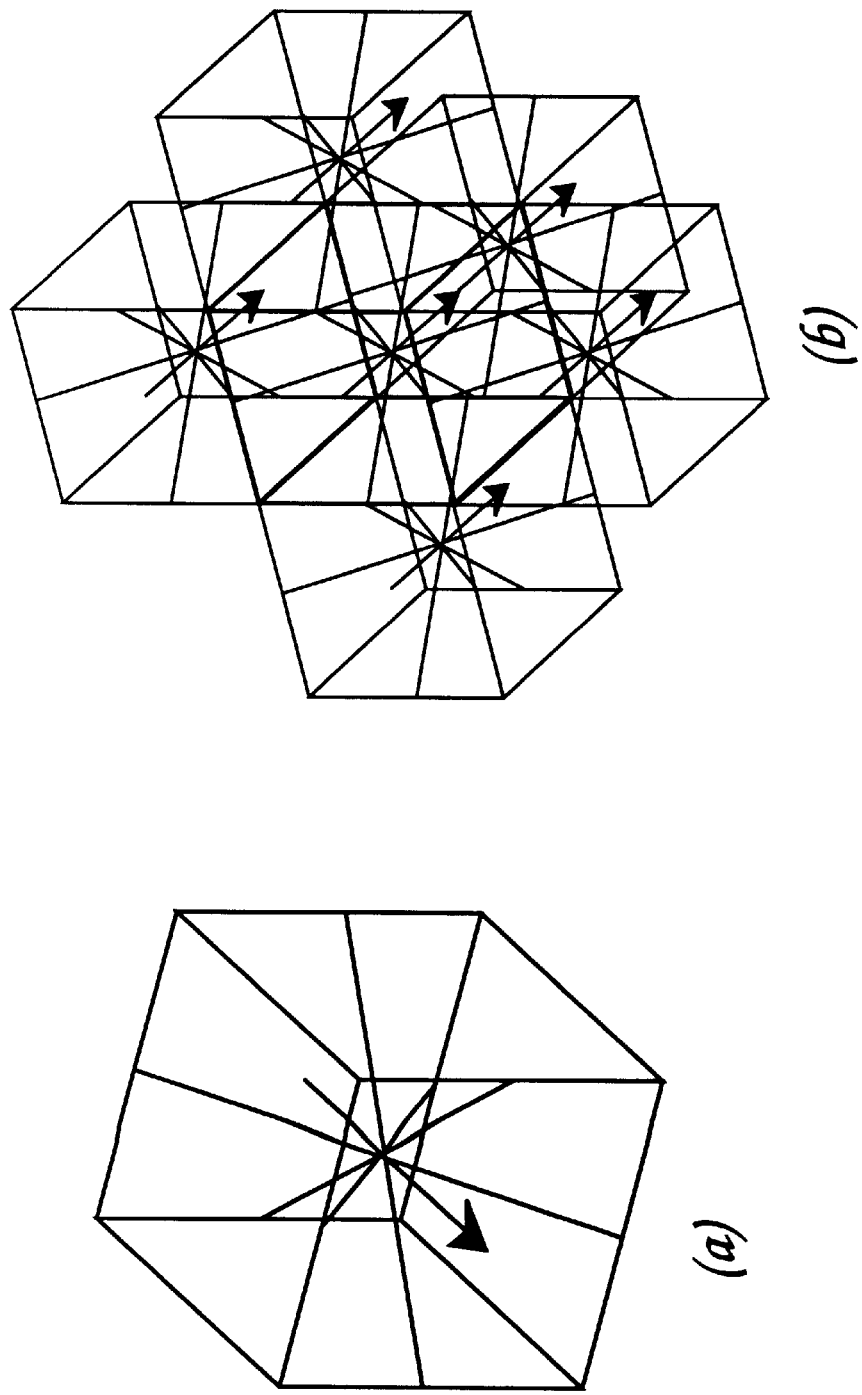
FIG. 39 comprising of FIGS. (a), and (b) shows a possible 5-LUT molecular FPGA cell.

The next demonstration of the tessellation will describe a 2-D CA architecture that is actually three-dimensional in its physical implementation. In this case, we employ a 5-LUT that is more easily shown in a 3-dimensional representation. Using the same basic concepts developed above, we shown a 5-LUT tesselation symbol and corresponding dependency arrangement in FIG. 39. Again, this 5-LUT design, though represented in three dimensions, is in fact still a two-dimensional architecture, based on its directional confinement. Unlike other two-dimensional CA architectures, however, localized feedback is not possible with the FIG. 38 architecture.

For two-dimensional physical implementations, most of the previous considerations apply, especially those pertaining to the introduction of user storage and programming the tiles. For three-dimensional implementations, such as FIG. 39, however, it is necessary to expand these concepts. In 3-D FPGA implementations, "tiles" become "blocks" and linear array structures (such as registers) become "tiles". In general, the concepts hold otherwise. Hence, three-dimensional FPGA blocks can be interfaced on any surface, as opposed to an edge. The blocks may terminate into a register tile (vice array). Blocks may be juxtaposed to form more complex architectures. Configuration bit streams are generated in a similar manner. The "cones of influence" now truly resemble 3-D cones.

Now, we provide a more concise description of the FPGA architecture in FIG. 38. This architectures is based on a 3-D array (block) comprised of a plurality of LUTs arranged in a directed, repeatable (x-column, y-row, z-level) structure that propagates in the positive y direction, each LUT having only periodic nearest neighbor connections to other LUTs with the tile patterned after a CA neighborhood arrangements (neighborhood radius r=1) and not any other bridging structures except at the boundaries, the definition of each LUT being allowed to be distinct and individually programmable for a particular logic function or for routing from external inputs or outputs, the last row of periodic LUT tiles being terminated in a linear array of registers, and edge coupling (edge corresponds to the first or last row, column, or level plane) being permitted between blocks (by allowing all LUTs to take on the same behavior, the tile directly models a 2-D non-hybrid CA as a degenerate case). This FPGA block may have periodic wire input/output attachments to any edge surface of block or register tile termini, subject to cone of influence effects. This FPGA possesses a means through the introduction of diagnostic test programs to test each block to locate defective LUTs. If cells within a block have datapath-related defects, the FPGA has means for mapping around a finite number of defective LUTs by remapping the functions affected onto good cells and ignoring the defective zone(s). The means exist to combine LUT blocks with user storage in the form of a tile of registers which interface the block at one or more edge surfaces. In the FIG. 38 case, it is possible to connect one or more LUT blocks together at interfacing surfaces. When blocks have coincident propagation directions no feedback is possible, and for the most part, the blocks simply act as a larger single block. When each block has a direction of propagation different from any block adjacent to it, feedback behavior may be possible, giving rise to complex digital systems behavior. If register planes are placed between such surfaces, synchronous behavior results. Otherwise, asynchronous behavior will be possible. Though more involved, a means can be readily established to program the blocks through serial bitstream patterns that are shifted through each LUT in succession using dedicated termini on each LUT, as a minimum containing a shift-in and a shift out with the possibility of one or more clocking signals to "drive" the shifting these patterns through the block. The reliabilty of a block due to potential defects in the bitstream shifting structures within and between LUTs can be improved by propagating the shift patterns through LUTs in the direction of block propagation and by using multiple serial streams, so that single point defects will not result in the loss of an entire block.

Figure 40:
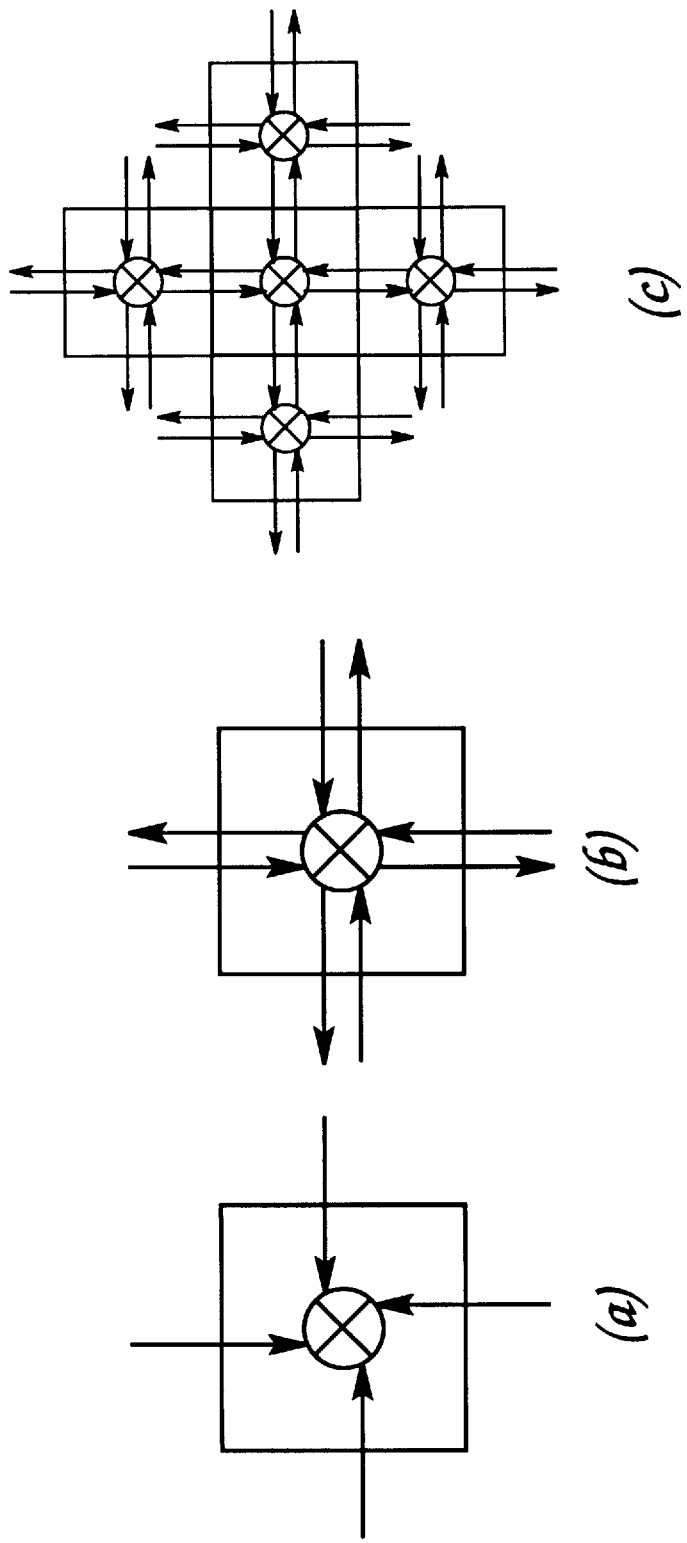
FIG. 40 comprising of FIGS. (a), (b), and (c) is an example of a 2-D MFPGA architecture based on a 4-LUT.

A more complex but straight-forward extension to two dimensions is shown in FIG. 40 using symbolic representations. In FIG. 40(*a*), a basic symbol is shown for a two-dimensional architecture based on a 4-input LUT (4-LUT) in which a center node can implement any Boolean function of its north, east, west, and south ("NEWS") neighbors. Such neighborhoods are referred to as "Manhattan", by association of grid-like Cartesian directions. This construction is commonly used in finite difference modeling grids, as well as very popular 2-D cellular automata referred to as the "game of life". The symbol is slightly modified in FIG. 40(*b*) to form a tesselation pattern, and a dependency arrangement is shown in FIG. 40(*c*). An important basic difference in strict CA definitions of a 2-D CA of neighborhood radius r=1 is that the cell itself is excluded from the neighborhood. The MFPGA implementations typically exclude a particular LUT from its own neighborhood to preclude oscillatory instability. When neighborhood definitions are such that a signal can form a loop, however, such feedback can still occur, which is an important consequence of a final class of MFPGA architectures.

A significant consequence on non-unidirectional architectures with dimensionality higher than one is the existence of strong coupling in the form of local feedback. Based on previous discussions, the existence of loop paths for signals within the CA structure creates feedback and therefore sequential behavior. Since this "prescription" of FPGA does not allow user storage to be embedded with the tile (register arrays are only permitted on the edges of a tile), then the sequential behavior is by definition asynchronous. It is possible to form oscillators and achieve a great number of manifestations of asynchronous behavior. As such, it may be necessary to incorporate additional circuitry, such as a global reset to control the behavior of errant configurations.

Another important consequence of non-directional architectures is the elimination of the "cones of influence". As such, the defect tolerance potential of the associated MFPGA architectures is further enhanced, as is the expressive range of Boolean implementations.

Now, a more concise description of the architecture of FIG. 40 can be developed. This architecture contains one or more arrays, each array containing of one or more cells of LUTs arranged in a directed, repeatable column, row (x, y) grid, the array being referred to as a tile, and each LUT having only periodic nearest neighbor connections to other LUTs with the tile patterned after specific 2-D CA "NEWS" (north, east, west, and south) neighborhood arrangements (neighborhood radius r=1, for example referring to the first NEWS nearest neighborhood set, neighborhood radius r=2, referring to the first and second nearest neighbors, and so on) and not any other bridging structures except at the boundaries, the definition of each LUT being allowed to be distinct and individually programmable for a particular logic function or for routing from external inputs or outputs, the last row of periodic LUT tiles being terminated in a linear array of registers, and side coupling being permitted between tiles (by allowing all LUTs to take on the same behavior, the tile directly models a 2-D non-hybrid CA as a degenerate case). This architecture permits periodic wire input/output attachments to any side of tile or register array termini, subject to the limits of neighborhood propagation effects. As before, a means exists to test each tile to locate defective LUTs through application of diagnostic programs, and a means for mapping around a finite number of defective LUTs through fimctional mapping can be applied. The concepts of storage are more involved. Not only are the "traditional" edge linear register arrays possible with this particular tile concept, but localized feedback within the 2-D tile could theoretically be exploited. So,with the inherent tightly coupled feedback loops within the tile structure is the possibility of race (hazard) conditions unless care in design is exercised. As before, the means exist to program the tiles through serial bitstream patterns that are shifted through each LUT in succession using dedicated termini on each LUT, as a minimum containing a shift-in and a shift out with the possibility of one or more clocking signals to "drive" the shifting these patterns through the tile. As before, the means to improve the reliability of a tile due to potential defects in the bitstream shifting structures within and between LUTs by propagating the shift patterns through LUTs by using multiple serial streams, so that single point defects will not result in the loss of an entire tile.

Finally, an important observation of the molecular FPGA as a class of architectural concepts is that they can be implemented in many different processes. Though inspired by and designed for implementations at a molecular scale, they can be implemented at larger scales in many different processes. The only essential implementation requirements are the existence of a complete binary logic system, a memory storage element, and an interconnection system. As such, these concepts can be rendered in conventional silicon and gallium arsenide and other semiconductor process technologies. They can be built in quantum dots (a nanoscale device concept) and other nanoscale/molecular process concepts. Cells, tiles, and entire architectures can be readily simulated, analyzed, and optimized based on application, process, and associated performance boundary conditions. If synchronous digital approaches can be employed, the present concept can directly leverage the substantial existing base on automated digital design tools. Its ability to achieve asynchronous and cellular automata behaviors hint of possibly more significant potential, although at present the disciplines for design in these "domains" are not as well established.

I claim:

1. A field programmable gate array (FPGA) having an m-input (m is an odd integer greater than 1) Boolean look-up-table-based (m-LUT-based) architecture analogous to a universal one-dimensional (1-D) binary cellular automata (CA) wherein a 1-D universal CA network in converted into a spatially unraveled two-dimensional (2-D) feedforward network, said FPGA comprising:

a. one or more arrays (tiles), each comprised of a plurality of LUTs arranged in a directed, repeatable x-column, y-row grid propagating in the positive y direction, with each LUT having only nearest neighbor connections to other LUTs and not any other bridging structures except at the boundaries, the definition of each LUT behavior in a tile being allowed to be distinct and individually programmable for a particular logic function;

b. each of said tiles having no specialized routing structures, since logic functions can imitate wiring from any LUT input to an output, allowing the LUTs to emulate both logic and (virtual) wiring;

c. identical and fixed neighborhood templates for all LUTs in a particular tile;

d. robust, periodic wire input/output attachments to any edge of said tile to bordering LUT termini, subject to cone of influence effects;

e. means to test each tile to locate defective LUTs by using diagnostic (temporary) test personalities;

f. means for mapping around a finite number of LUTs having a defective data path;

g. linear register array means inserted at the end of a tile and between tiles on any edge, whereby synchronous behavior is produced by registering signals between tiles in synchronization with an overall clock;

h. means to achieve sequential feedback behavior in the 1-D architecture by combining tiles in a way that can produce synchronous or asynchronous loops in signal propagation;

i. means to program the tiles through serial bitstream patterns that are shifted through each LUT in succession using dedicated termini on each LUT, as a minimum containing a shift-in and a shift out with the possibility of one or more clocking signals to drive the shifting of said patterns through the tile; and j. means to improve the reliability of a tile due to potential defects in the bitstream shifting structures within and between LUTs by propagating the shift patterns in the direction of array propagation and by using multiple serial streams, such that single point defects will not result in the loss of an entire tile.

2. The FPGA of claim 1, wherein said Boolean look-up table architecture is a 3-input Boolean look-up-table-based (3-LUT-based) tile that implements a spatially unraveled two-dimensional feedforward network equivalent in space to a 1-D CA with neighborhood of three in time.

3. A field programmable gate array (FPGA) having an m-input Boolean look-up-table-based (m-LUT-based) architecture analogous to a universal two-dimensional (2-D) binary cellular automata (CA) wherein a 2-D universal CA network in converted into a spatially unraveled three-dimensional (3-D) feedforward network, said FPGA comprising:

a. one or more arrays (blocks), each comprised of a plurality of LUTs arranged in a directed, repeatable x-column, y-row, z-level grid propagating in the positive y-direction, with each LUT having only nearest neighbor connections to other LUTs and not any other bridging structures except at the boundaries, the definition of each LUT behavior in a block being allowed to be distinct and individually programmable for a particular logic function;

b. each of said blocks having no specialized routing structures, since logic functions can imitate wiring from any LUT input to an output, allowing the LUTs to emulate both logic and (virtual) wiring;

c. identical and fixed neighborhood templates for all LUTs in a particular tile;

d. periodic wire input/output attachments to any edge surface of said block to bordering LUT termini, subject to cone of influence effects;

e. means to test each block to locate defective LUTs by using diagnostic (temporary) test personalities;

f. means for mapping around a finite number of LUTs with a defective data path;

g. planar register array means inserted at the end of a block and between blocks on any edge surface, whereby synchronous behavior is produced by registering signals between blocks in synchronization with an overall clock;

h. means to achieve sequential feedback behavior in the 2-D architecture through combining blocks in a way that can produce loops in signal propagation (synchronous or asynchronous);

i. means to program the blocks through serial bit stream patterns that are shifted through each LUT in succession using dedicated termini on each LUT, as a minimum containing a shift-in and a shift out with the possibility of one or more clocking signals to drive the shifting of said patterns through the block; and j. means to improve the reliability of a block due to potential defects in the bit stream shifting structures within and between LUTs by propagating the shift patterns in the direction of array propagation and by using multiple serial streams, such that single point defects will not result in the loss of an entire block.

4. The FPGA of claim 3, wherein said Boolean look-up table architecture is a 5-input Boolean look-up-table-based (5-LUT-based) FPGA architecture having a circuit connection topology analogous to the propagation of a universal two-dimensional (2-D) binary cellular automata (CA), thereby converting the 2-D CA into a spatially unraveled 3-D feedforward network and resulting in a field programmable gate array.

5. A field programmable gate array (FPGA) having an m-input Boolean look-up-table-based (m-LUT-based) architecture analogous to a non-directional universal two-dimensional (2-D) binary cellular automata (CA), said FPGA comprising:

a. one or more arrays (tiles), each comprised of a plurality of LUTs arranged in a directed, repeatable x-column, y-row grid propagating in the positive y direction, with each LUT having only nearest neighbor connections to other LUTs in "Manhattan" (north, east, south, west) directions and not any other bridging structures except at the boundaries, the definition of each LUT behavior in a block being allowed to be distinct and individually programmable for a particular logic function;

b. each of said tiles having no specialized routing structures, since logic functions can imitate wiring from any LUT input to an output, allowing the LUTs to emulate both logic and (virtual) wiring;

c. identical and fixed neighborhood templates for all LUTs in a particular tile;

d. robust, periodic wire input/output attachments to any edge surface of said tile to bordering LUT termini;

e. means to test each tile to locate defective LUTs by using diagnostic (temporary) test personalities;

f. means for mapping around a finite number of LUTs with a defective data path;

g. register array means inserted at the end of a tile and between tiles on any edge, whereby synchronous behavior is produced by registering signals between tiles in synchronization with an overall clock;

h. means to achieve sequential feedback behavior in the 2-D architecture through combining blocks in a way that can produce loops in signal propagation (synchronous or asynchronous);

i. means to program the blocks through serial bit stream patterns that are shifted through each LUT in succession using dedicated termini on each LUT, as a minimum containing a shift-in and a shift out with the possibility of one or more clocking signals to drive the shifting of these patterns through the tile; and j. means to improve the reliability of a tile due to potential defects in the bit stream shifting structures within and between LUTs by propagating the shift patterns in the direction of array propagation and by using multiple serial streams, so that single point defects will not result in the loss of an entire block.

6. The FPGA of claim 5, wherein said Boolean look-up table architecture is a 4-input Boolean look-up-table-based (4-LUT-based) FPGA architecture having a circuit connection topology analogous to that of a universal two-dimensional (2-D) binary cellular automata (CA), with each LUT connected to its immediate neighbors in x and y, resulting in a field programmable gate array.

* * * * *